United States Patent
Henley et al.

(10) Patent No.: US 9,640,711 B2
(45) Date of Patent: *May 2, 2017

(54) SUBSTRATE CLEAVING UNDER CONTROLLED STRESS CONDITIONS

(71) Applicant: Silicon Genesis Corporation, Santa Clara, CA (US)

(72) Inventors: Francois Henley, Aptos, CA (US); Al Lamm, Suisun City, CA (US); Yi-Lei Chow, Los Altos, CA (US)

(73) Assignee: Silicon Genesis Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/167,291

(22) Filed: May 27, 2016

(65) Prior Publication Data

US 2016/0276522 A1 Sep. 22, 2016

Related U.S. Application Data

(60) Continuation of application No. 14/618,940, filed on Feb. 10, 2015, now Pat. No. 9,356,181, which is a
(Continued)

(51) Int. Cl.
*H01L 21/30* (2006.01)
*H01L 31/18* (2006.01)
(Continued)

(52) U.S. Cl.
CPC .......... *H01L 31/1892* (2013.01); *B26F 3/002* (2013.01); *H01L 21/304* (2013.01);
(Continued)

(58) Field of Classification Search
CPC . H01L 31/18; H01L 31/03921; H01L 31/068; H01L 31/0687; H01L 31/1804;
(Continued)

(56) References Cited

U.S. PATENT DOCUMENTS 2,614,055 A  10/1952 Senarelens
3,117,002 A  1/1964 Bronson et al.
(Continued)

FOREIGN PATENT DOCUMENTS

DE  834363  3/1952
DE  19753494 A1  10/1998
(Continued)

OTHER PUBLICATIONS

Adan et al., SOI as a mainstream IC technology Proceedings 1998 IEEE International SOI conference, Oct. 1998, pp. 9-12.
(Continued)

*Primary Examiner* — Kevin M Picardat

(57) ABSTRACT

A thickness of material may be detached from a substrate along a cleave plane, utilizing a cleaving process controlled by a releasable constraint plate. In some embodiments this constraint plate may comprise a plate that can couple side forces (the "P-plate") and a thin, softer compliant layer (the "S-layer") situated between the P-plate and the substrate. In certain embodiments a porous surface within the releasable constraint plate and in contact to the substrate, allows the constraint plate to be secured to the substrate via a first pressure differential. Application of a combination of a second pressure differential within a pre-existing cleaved portion, and a linear force to a side of the releasable constraint plate bound to the substrate, generates loading that results in controlled cleaving along the cleave plane.

17 Claims, 23 Drawing Sheets

Related U.S. Application Data division of application No. 13/225,172, filed on Sep. 2, 2011, now Pat. No. 8,993,410, which is a continuation-in-part of application No. 12/730,113, filed on Mar. 23, 2010, now Pat. No. 8,110,480, which is a continuation of application No. 11/852,088, filed on Sep. 7, 2007, now Pat. No. 7,811,900, said application No. 13/225,172 is a continuation-in-part of application No. 12/435,230, filed on May 4, 2009, now Pat. No. 9,362,439, said application No. 13/225,172 is a continuation-in-part of application No. 12/460,898, filed on Jul. 24, 2009, now Pat. No. 8,293,619.

(60) Provisional application No. 60/825,095, filed on Sep. 8, 2006, provisional application No. 61/051,307, filed on May 7, 2008, provisional application No. 61/092,683, filed on Aug. 28, 2008.

(51) Int. Cl.

| | | |
|---|---|---|
| H01L 21/683 | (2006.01) | |
| H01L 21/67 | (2006.01) | |
| H01L 21/762 | (2006.01) | |
| H01L 21/78 | (2006.01) | |
| H01L 31/0392 | (2006.01) | |
| H01L 31/068 | (2012.01) | |
| H01L 31/0687 | (2012.01) | |
| H01L 21/304 | (2006.01) | |
| B26F 3/00 | (2006.01) | |
| H01L 21/66 | (2006.01) | |

(52) U.S. Cl.
CPC ...... *H01L 21/67092* (2013.01); *H01L 21/683* (2013.01); *H01L 21/6835* (2013.01); *H01L 21/76254* (2013.01); *H01L 21/7813* (2013.01); *H01L 22/12* (2013.01); *H01L 31/03921* (2013.01); *H01L 31/068* (2013.01); *H01L 31/0687* (2013.01); *H01L 31/18* (2013.01); *H01L 31/1804* (2013.01); *Y02E 10/544* (2013.01); *Y02E 10/547* (2013.01); *Y02P 70/521* (2015.11); *Y10T 225/10* (2015.04); *Y10T 225/30* (2015.04); *Y10T 225/393* (2015.04)

(58) Field of Classification Search
CPC ........... H01L 31/1892; H01L 21/67092; H01L 21/683; H01L 21/304; H01L 21/6835; H01L 21/6836; H01L 21/76254; H01L 22/12
USPC ................................ 438/458, 459, 463, 464
See application file for complete search history.

(56) References Cited

U.S. PATENT DOCUMENTS

| | | |
|---|---|---|
| 3,225,820 A | 12/1965 | Riordan |
| 3,390,033 A | 6/1968 | Brown |
| 3,392,069 A | 7/1968 | Merkel et al. |
| 3,551,213 A | 12/1970 | Boyle |
| 3,770,499 A | 11/1973 | Crowe et al. |
| 3,786,359 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |
| 3,915,757 A | 10/1975 | Engel |
| 3,946,334 A | 3/1976 | Yonezu |
| 3,957,107 A | 5/1976 | Alotz et al. |
| 3,964,957 A | 6/1976 | Walsk |
| 3,993,909 A | 11/1976 | Drews et al. |
| 4,006,340 A | 2/1977 | Gorinas |
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,495,219 A | 1/1985 | Kato et al. |
| 4,500,563 A | 2/1985 | Ellenberger et al. |
| 4,508,056 A | 4/1985 | Bruel et al. |
| 4,530,149 A | 7/1985 | Jastrzebski et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo |
| 4,727,047 A | 2/1988 | Bozler et al. |
| 4,764,394 A | 8/1988 | Conrad |
| 4,766,086 A | 8/1988 | Oshima et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reismann et al. |
| 4,894,709 A | 1/1990 | Phillips et al. |
| 4,906,594 A | 3/1990 | Yoneda |
| 4,931,405 A | 6/1990 | Kamijo et al. |
| 4,948,458 A | 8/1990 | Ogle |
| 4,952,273 A | 8/1990 | Popov |
| 4,956,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi et al. |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,141,878 A | 8/1992 | Benton et al. |
| 5,162,241 A | 11/1992 | Mori et al. |
| 5,196,355 A | 3/1993 | Wittkower |
| 5,198,071 A | 3/1993 | Scudder et al. |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,213,986 A | 5/1993 | Pinker et al. |
| 5,234,529 A | 8/1993 | Johnson |

(56) References Cited

U.S. PATENT DOCUMENTS

| | | |
|---|---|---|
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,403,434 A | 4/1995 | Moslehi |
| 5,404,079 A | 4/1995 | Ohkuni et al. |
| 5,405,480 A | 4/1995 | Benzing et al. |
| 5,409,563 A | 4/1995 | Cathey |
| 5,411,592 A | 5/1995 | Ovshinsky et al. |
| 5,413,679 A | 5/1995 | Godbey |
| 5,427,052 A | 6/1995 | Ohta et al. |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike et al. |
| 5,494,835 A | 2/1996 | Bruel |
| 5,504,328 A | 4/1996 | Bonser |
| 5,506,176 A | 4/1996 | Takizawa |
| 5,508,207 A | 4/1996 | Horai et al. |
| 5,514,235 A | 5/1996 | Mitani et al. |
| 5,518,965 A | 5/1996 | Menigaux |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,686,980 A | 11/1997 | Hirayama et al. |
| 5,700,333 A | 12/1997 | Yamazaki et al. |
| 5,705,421 A | 1/1998 | Matsushita et al. |
| 5,710,057 A | 1/1998 | Kenney |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |
| 5,763,319 A | 6/1998 | Ling et al. |
| 5,783,022 A | 7/1998 | Cha et al. |
| 5,793,913 A | 8/1998 | Kovacic |
| 5,804,086 A | 9/1998 | Bruel |
| 5,811,348 A | 9/1998 | Matsushita et al. |
| 5,821,158 A | 10/1998 | Shishiguchi |
| 5,824,595 A | 10/1998 | Igel et al. |
| 5,827,751 A | 10/1998 | Nuyen |
| 5,840,590 A | 11/1998 | Myers, Jr. et al. |
| 5,841,931 A | 11/1998 | Foresi |
| 5,854,123 A | 12/1998 | Sato et al. |
| 5,863,830 A | 1/1999 | Bruel et al. |
| 5,869,387 A | 2/1999 | Sato et al. |
| 5,869,405 A | 2/1999 | Gonzalez et al. |
| 5,877,070 A | 3/1999 | Goesele et al. |
| 5,882,987 A | 3/1999 | Srikrishnan |
| 5,897,743 A | 4/1999 | Fujimoto et al. |
| 5,906,951 A | 5/1999 | Chu et al. |
| 5,909,627 A | 6/1999 | Egloff |
| 5,920,764 A | 7/1999 | Hanson et al. |
| 5,942,050 A | 8/1999 | Green et al. |
| 5,953,622 A | 9/1999 | Lee et al. |
| 5,966,620 A | 10/1999 | Sakaguchi et al. |
| 5,966,625 A | 10/1999 | Zhong et al. |
| 5,968,279 A | 10/1999 | MacLeish et al. |
| 5,985,742 A | 11/1999 | Henley et al. |
| 5,993,677 A | 11/1999 | Biasse et al. |
| 5,994,207 A | 11/1999 | Henley et al. |
| 6,004,868 A | 12/1999 | Rolfson et al. |
| 6,008,128 A | 12/1999 | Habuka et al. |
| 6,010,579 A | 1/2000 | Henley et al. |
| 6,013,563 A | 1/2000 | Henley et al. |
| 6,013,567 A | 1/2000 | Henley et al. |
| 6,020,252 A | 2/2000 | Aspar et al. |
| 6,027,988 A | 2/2000 | Cheung et al. |
| 6,033,974 A | 3/2000 | Henley et al. |
| 6,048,411 A | 4/2000 | Henley et al. |
| 6,066,915 A | 5/2000 | Pepi |
| 6,077,383 A | 6/2000 | Laporte |
| 6,083,324 A | 7/2000 | Henley et al. |
| 6,103,599 A | 8/2000 | Henley et al. |
| 6,107,213 A | 8/2000 | Tayanaka |
| 6,107,653 A | 8/2000 | Fitzgerald |
| 6,120,597 A | 9/2000 | Levy et al. |
| 6,143,628 A | 11/2000 | Sato et al. |
| 6,150,239 A | 11/2000 | Goesele et al. |
| 6,159,824 A | 12/2000 | Henley et al. |
| 6,162,705 A | 12/2000 | Henley et al. |
| 6,171,965 B1 | 1/2001 | Kang |
| 6,171,982 B1 | 1/2001 | Sato |
| 6,184,111 B1 | 2/2001 | Henley et al. |
| 6,190,998 B1 | 2/2001 | Bruel et al. |
| 6,191,007 B1 | 2/2001 | Matsui et al. |
| 6,194,327 B1 | 2/2001 | Gonzalez et al. |
| 6,204,151 B1 | 3/2001 | Malik et al. |
| 6,214,701 B1 | 4/2001 | Matsushita et al. |
| 6,225,192 B1 | 5/2001 | Aspar et al. |
| 6,251,754 B1 | 6/2001 | Ohshima et al. |
| 6,263,941 B1 | 7/2001 | Bryan et al. |
| 6,274,464 B2 | 8/2001 | Drobny et al. |
| 6,287,941 B1 | 9/2001 | Kang et al. |
| 6,291,321 B1 | 9/2001 | Fitzgerald |
| 6,294,478 B1 | 9/2001 | Sakaguchi et al. |
| 6,335,269 B1 | 1/2002 | Sato |
| 6,342,436 B1 | 1/2002 | Takizawa |
| 6,376,806 B2 | 4/2002 | Yoo |
| 6,452,091 B1 | 9/2002 | Nakagawa et al. |
| 6,455,397 B1 | 9/2002 | Belford |
| 6,455,399 B2 | 9/2002 | Malik et al. |
| 6,503,773 B2 | 1/2003 | Fitzgerald |
| 6,513,564 B2 | 2/2003 | Bryan et al. |
| 6,514,836 B2 | 2/2003 | Belford |
| 6,534,381 B2 | 3/2003 | Cheung et al. |
| 6,563,152 B2 | 5/2003 | Roberts et al. |
| 6,621,131 B2 | 9/2003 | Murthy et al. |
| 6,723,661 B2 | 4/2004 | Fitzgerald |
| 6,809,009 B2 | 10/2004 | Aspar et al. |
| 6,858,107 B2 | 2/2005 | Ghyselen et al. |
| 6,911,376 B2 | 6/2005 | Yoo |
| 6,969,668 B1 | 11/2005 | Kang et al. |
| 7,019,339 B2 | 3/2006 | Atwater |
| 7,081,657 B2 | 7/2006 | Faris |
| 7,273,998 B2 | 9/2007 | Wu et al. |
| 7,354,815 B2 | 4/2008 | Henley |
| 7,811,900 B2 | 10/2010 | Henley |
| 8,993,410 B2 * | 3/2015 | Henley ............ H01L 21/67092 438/458 |
| 9,356,181 B2 * | 5/2016 | Henley ............ H01L 21/67092 |
| 2001/0019371 A1 | 9/2001 | Zavracky et al. |
| 2001/0039095 A1 | 11/2001 | Marty |

(56) References Cited

U.S. PATENT DOCUMENTS

| | | |
|---|---|---|
| 2002/0064924 A1 | 5/2002 | Cheung et al. |
| 2002/0174828 A1 | 11/2002 | Vasat et al. |
| 2003/0077885 A1 | 4/2003 | Aspar et al. |
| 2003/0096098 A1 | 5/2003 | Ovshinsky et al. |
| 2003/0140844 A1 | 7/2003 | Maa et al. |
| 2003/0186493 A1 | 10/2003 | Iwasaki et al. |
| 2004/0253794 A1 | 12/2004 | Faris |
| 2005/0118754 A1 | 6/2005 | Henley et al. |
| 2005/0189013 A1 | 9/2005 | Hartley |
| 2006/0014366 A1 | 1/2006 | Currie |
| 2006/0030122 A1 | 2/2006 | Shimoda et al. |
| 2006/0038182 A1 | 2/2006 | Rogers et al. |
| 2008/0179547 A1 | 7/2008 | Henley |
| 2009/0194153 A1 | 8/2009 | Hilali et al. |
| 2009/0194163 A1 | 8/2009 | Sivaram et al. |
| 2009/0194164 A1 | 8/2009 | Sivaram et al. |
| 2009/0197367 A1 | 8/2009 | Sivaram et al. |
| 2009/0197368 A1 | 8/2009 | Sivaram et al. |
| 2009/0242010 A1 | 10/2009 | Herner |
| 2009/0242031 A1 | 10/2009 | Herner et al. |
| 2009/0277314 A1 | 11/2009 | Henley |
| 2009/0283669 A1 | 11/2009 | Parrill et al. |
| 2009/0283705 A1 | 11/2009 | Parrill et al. |
| 2009/0293931 A1 | 12/2009 | Petti |
| 2010/0031995 A1 | 2/2010 | Herner et al. |
| 2010/0032007 A1 | 2/2010 | Hilali et al. |
| 2010/0032010 A1 | 2/2010 | Herner et al. |
| 2010/0055874 A1 | 3/2010 | Henley |
| 2010/0072401 A1 | 3/2010 | Parrill et al. |
| 2010/0139755 A1 | 6/2010 | Petti et al. |
| 2010/0147448 A1 | 6/2010 | Agarwal et al. |
| 2010/0154873 A1 | 6/2010 | Hilali et al. |
| 2010/0159629 A1 | 6/2010 | Herner |
| 2010/0159630 A1 | 6/2010 | Hilali et al. |
| 2010/0167454 A1 | 7/2010 | Zuniga |
| 2010/0178723 A1 | 7/2010 | Henley |
| 2010/0184248 A1 | 7/2010 | Hilali et al. |
| 2010/0224238 A1 | 9/2010 | Hilali et al. |
| 2010/0229928 A1 | 9/2010 | Zuniga et al. |
| 2010/0243912 A1 | 9/2010 | Richards et al. |

FOREIGN PATENT DOCUMENTS

| | | |
|---|---|---|
| EP | 084287 A1 | 7/1983 |
| EP | 099778 A1 | 2/1984 |
| EP | 155875 A1 | 2/1984 |
| EP | 112238 A2 | 6/1984 |
| EP | 181249 A1 | 5/1986 |
| EP | 112230 A1 | 4/1987 |
| EP | 0296804 A2 | 12/1988 |
| EP | 164281 A1 | 2/1989 |
| EP | 355913 A1 | 2/1990 |
| EP | 379828 A2 | 8/1990 |
| EP | 459177 A2 | 12/1991 |
| EP | 504714 A2 | 9/1992 |
| EP | 533551 A1 | 3/1993 |
| EP | 0553852 A2 | 8/1993 |
| EP | 0660140 A1 | 6/1995 |
| EP | 0665587 A1 | 8/1995 |
| EP | 0665588 A1 | 8/1995 |
| EP | 0703609 A1 | 3/1996 |
| EP | 763849 A1 | 3/1997 |
| EP | 0807970 | 11/1997 |
| EP | 0843344 A1 | 5/1998 |
| EP | 867670 A2 | 9/1998 |
| EP | 867921 A2 | 9/1998 |
| EP | 0905767 | 3/1999 |
| EP | 0961312 A2 | 12/1999 |
| EP | 0971395 | 1/2000 |
| EP | 1085562 A2 | 3/2001 |
| EP | 2088632 A2 | 2/2009 |
| EP | 2088633 A2 | 2/2009 |
| FR | 1558881 | 2/1969 |
| FR | 2235474 A1 | 1/1975 |
| FR | 2261802 A1 | 9/1975 |
| FR | 2266304 A | 10/1975 |
| FR | 2298880 A1 | 8/1976 |
| FR | 2519437 A1 | 7/1983 |
| FR | 2529383 A1 | 12/1983 |
| FR | 2575601 A1 | 7/1984 |
| FR | 2537768 A1 | 8/1985 |
| FR | 2560426 A1 | 8/1985 |
| FR | 2563377 A1 | 10/1985 |
| FR | 2537777 A1 | 4/1986 |
| FR | 2681472 A1 | 3/1993 |
| FR | 2714524 A1 | 6/1995 |
| FR | 2715501 A1 | 7/1995 |
| FR | 2715502 A1 | 7/1995 |
| FR | 2715503 | 7/1995 |
| FR | 2720189 A1 | 11/1995 |
| FR | 2725074 A1 | 3/1996 |
| GB | 2211991 A | 7/1989 |
| GB | 2231197 A | 11/1990 |
| JP | 53-104156 A | 9/1978 |
| JP | 58-030145 | 2/1983 |
| JP | 58-144475 A | 8/1983 |
| JP | 59-046750 A | 3/1984 |
| JP | 59-054217 A | 3/1984 |
| JP | 59-114744 A | 7/1984 |
| JP | 59-139539 | 8/1984 |
| JP | 59-193904 | 11/1984 |
| JP | 60-207237 A | 10/1985 |
| JP | 60-235434 A2 | 11/1985 |
| JP | 61-125012 | 6/1986 |
| JP | 3-109731 A | 5/1991 |
| JP | 3-132055 A | 6/1991 |
| JP | 3-265156 A | 11/1991 |
| JP | 4-076503 | 3/1992 |
| JP | 4-246594 A | 9/1992 |
| JP | 4-298023 A | 10/1992 |
| JP | 5-211128 A | 8/1993 |
| JP | 5-218053 | 8/1993 |
| JP | 7-164728 | 6/1995 |
| JP | 7-215800 A | 8/1995 |
| JP | 7-254690 A | 10/1995 |
| JP | 7-263291 A | 10/1995 |
| JP | 8-097389 A | 4/1996 |
| JP | 10-200080 A | 7/1998 |
| JP | 10-275905 | 10/1998 |
| JP | 11-045840 A | 2/1999 |
| JP | 2901031 B2 | 6/1999 |
| JP | 2910001 B2 | 6/1999 |
| JP | 2000-94317 A | 4/2000 |
| WO | WO 9510718 A1 | 4/1995 |
| WO | WO 9520824 A1 | 8/1995 |
| WO | WO 9531825 A1 | 11/1995 |
| WO | WO 9935674 A1 | 7/1999 |
| WO | WO 0063965 | 10/2000 |
| WO | WO 0154175 | 7/2001 |
| WO | WO 0099943 A2 | 8/2009 |
| WO | WO 0120719 A2 | 10/2009 |

OTHER PUBLICATIONS

Alles et al., Thin Film Silicon on Insulator: An Enabling Technology, Semiconductor International, pp. 67-72 (1997).

Auberton-Herve, "SOI: Materials to Systems", International Electron Devices Meeting, 1996, San Francisco, CA, USA, Dec. 8-11, 1996, New York, NY, USA, IEEE, US, Dec. 8, 1996, pp. 3-10.

Basta, Ion-Beam Implantation, High Technology (1985).

Belford et al., Performance-Augmented CMOS using Back-end Uni axial Strain 2002 Device Research Conference, Santa Barbara, CA.

Brendel, A Novel Process for Ultrathin Monocrystalline Silicon Solar Cells on Glass, 14th European Photovoltaic Solar Energy Conference Barcelona, Spain, Jun. 30-Jul. 4, 1997.

Burggraaff, Advanced Plasma Source: What's Working?, Semiconductor International, pp. 56-59 (May 1994).

Carter et al., "The Collection of IONS Implanted in Semiconductors II. Range distributions Derived from Collection and Sputter-Etch Curves," Radiation Effects, vol. 16, pp. 107-114 (1972).

Cassidy, Ion Implantation Process Toughens Metalworking Tools, Modern Metals, pp. 65-67 (1984).

(56) References Cited

OTHER PUBLICATIONS

Centura EPI "Epitaxial Deposition Chamber Specifications" Brochure, Applied Materials, Mar. 1994.
Cheung, Plasma Immersion Ion Implantation for Semiconductor Processing, Material Chemistry and Physics, 46(2-3): 132-139 (1996).
Cho et al., "Vapor Etching of Silicon Substrates with HCI Gas" Journal of the Korean Institute of Electronic Engineering, Apr. 25, 1984, pp. 41-45, vol. 21, No. 5.
Choyke et al., A Comparative Study of Near-Surface Effects Due to Very High Fluence H+ Implantation in Single Crystal FZ, CZ, and Web SI, Mat. Res. Soc. Symp. Proc., 27:359-364 (1984).
Choyke et al., Implanted Hydrogen Effects at High Concentrations in Model Low Z Shielding Materials, J. Nuc. Mtrls., 122-23:1585-86 (1984).
Choyke et al., Mechanical Response of Single Crystal Si to Very High Fluence H+ Implantation, Nuc. Instr. Meth., 209-210:407-412 (1983).
Chuang et al., Design Considerations of SOI Digital CMOS VLSI, Proceedings 1998 IEEE International SOI Conference, Oct. 1998, pp. 5-8.
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc., 438:333-343 (1997).
Comita et al., Low Temperature SI and SIGe Epitaxy for sub 01. μm Technology, AMAT Conference Paper, Mar. 10, 2003.
Corbett et al., Embrittlement of Materials: Si(H) as a Model System, J Nuc. Mtrls., 169:179-184 (1989).
Deegan et al., Wavy and rough cracks in silicon. Center for Nonlinear Dynamics and Department of Physics, The University of Texas at Austin, Austin, Texas 78712, USA, Phys. Rev. E 67, 066209 (2003) [7 pages].
EPI Centura, Systems Specifications Brochure, Applied Materials, Oct. 1996.
European Patent Search Report for European Application No. 07016247.4, dated Apr. 24, 2008, 8 pages total.
European Patent Search Report for European Application No. 08153348.1, dated Jun. 3, 2008, 8 pages total.
Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.
Final Office Action for U.S. Appl. No. 12/730,113, date of mailing Feb. 25, 2011, 5 pages total.
Ge et al., Process-Strained Si (PSS) CMOS Technology Featuring 3D Strain Engineering, IEEE International Electron Devices Meeting, Washington, DC, Dec. 2003.
Grovenor, C.R.M., Microelectric Materials (1989), pp. 73-75.
Habuka et al., Change in Microroughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.
Hobart et al., "Fabrication of SOI Substrates with Ultra-Thin Si Layers" Electronics Letters, IEE Stevenage, GB, vol. 34, No. 12, Jun. 11, 1998 (Jun. 11, 1998), pp. 1265-1267.
Hobart et al., "Ultra-Cut: A Simple Technique for the Fabrication of SOI Substrates with Ultra-Thin (>5 nm) Silicon Films," IEEE International SOI Conference, 1998. Proceedings, Stuart, FL, USA, Oct. 5-8, 1998, New York, NY, USA, IEEE, US, Oct. 5, 1998, pp. 145-146.
Hulett et al., Ion Nitriding and Ion Implantation: A Comparison, Metal Progress, pp. 18-21 (1985).
I.B.M., Technical Disclosure Bulletin, vol. 29: No. 3, p. 1416 (Aug. 1986).

International Search Report and Written Opinion of PCT Application No. PCT/US07/78023, date of mailing Jul. 25, 2008, 13 pages total.
IQE's Smooth Approach Increases Carrier Mobilities, News, www.compoundsemiconductor.net, Dec. 2004.
Johnson et al., Hydrogen-Induced Platelets in Silicon: Separation of Nucleation and Growth, Mtrls. Sci. Forum, 83-87:33-38 (1992).
Krivokapic et al., "Strain Relaxation in Narrow Width Strained Silicon Devices with Poly and Metal Gates", Electrochemical Society Proceedings vol. 2004-07, pp. 459-469, Pennington, New Jersey USA (2004).
Lawn, Fracture of Brittle Solids, Second Edition, NIST Fellow, Cambridge University Press, pp. 1-13.
Lee et al., A Novel Pattern Transfer Process for Bonded SOI Giga-bit DRAMS, 1996 IEEE Int'l SOI Conference Proceedings, IEEE Electron Devices Society, (1996.).
Lee et al., Strained Silicon Thin-Film Transistors Fabricated on Glass, Appl. Phys. Lett 86, 103504 (2005).
Li, Novel Semiconductor Substrate Formed by Hydrogen Ion Implantation into Silicon, Appl. Phys. Lett., 55(21):2223-2224 (1989).
Lu et al., SOI Material Technology Using Plasma Immersion Ion Implantation, Proceedings 1996 IEEE International SOI Conference (Oct. 1996).
Mahajan et al., Principles of Growth and Processing Semiconductors, WCB McGraw-Hill, chapter 6, pp. 262-269. (1999).
Mantl et al. Enhanced Strain Relaxation of Epitaxial SiGe-Layers on Si(100) Improved by Hydrogen Implantation, Nuclear Instruments and Methods in Physics Research Section B, Jan. 1999, v. 147, Issue 1-4, p. 29-34.
Matsuda et al., Large Diameter Ion Beam Implantation System, Nuclear Instruments and Methods, B21:314-316 (1987).
Merriam Webster's Collegiate Dictionary, 10$^{th}$ Ed., p. 388.
Milnes et al., Peeled Film Technology for Solar Cells, pp. 338-341. (1975).
Moreau, Semiconductor Lithography, Principles, Practices, and Materials, Plenum Press (1988).
Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.
Morrison et al., Deposition of Micro-Crystalline Silicon using a Graphite Filament in the Hot Wire CVD Technique, J. Vac. Sci. Technol A19 (6), Nov./Dec. 2001, p. 2817.
Mukashev et al., Hydrogen Implantation into Silicon: Infra-Red Absorption Spectra and Electrical Properties, Institute of High Energy Physics, Academy of Sciences of the Kazakh SSR, Alma-Ata 1; 91, 509 (1985).
Non-Final Office Action for U.S. Appl. No. 11/852,088, date of mailing Dec. 7, 2009, 4 pages total.
Non-Final Office Action for U.S. Appl. No. 12/730,113, date of mailing Aug. 30, 2010, 4 pages total.
Notice of Allowance for U.S. Appl. No. 11/852,088, date of mailing Jun. 30, 2010, 5 pages total.
Notice of Allowance for U.S. Appl. No. 12/730,113, date of mailing Oct. 11, 2011, 7 pages total.
Onojima et al., Lattice Relaxation Process of AlN Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.
Oshima et al., Defects in Si Irradiated with D-T neutrons, D and He Ions, J. Nuc. Mtrls., 179-181:947-950 (1991).
Picraux et al., Ion Implantation of Surfaces, Scientific American, 252(3):102-113 (1985).
Renier et al., A New Low-Energy Ion Implanter for Bombardment of Cylindrical Surfaces, Vacuum, 35(12):577-578 (1985).
Requirement for Restriction/Election for U.S. Appl. No. 11/852,088, mailed on Jul. 24, 2009, 7 pages.
Saenger et al., Amorphization/templated recrystallization Method for Changing the Orientation of Single-Crystal Silicon: An Alternative Approach to Hybrid Orientation Substrates, Appl. Phys. Lett. 87, 221911, 2005.

(56) References Cited

OTHER PUBLICATIONS

Sato et al., Suppression of Si Etching During Hydrogen Annealing of Silicon-on-Insulator, Proceedings of 1998 IEEE Int. SOI Conference, pp. 17-18 from conference held Oct. 5-8, 1998.
Sherman et al., Energy Considerations in Crack Deflection Phenomenon in Single Crystal Silicon, International Journal of Fracture, vol. 140, No. 1-4, 2006 , pp. 125-140(16).
Sioshansi, Ion Beam Modification of Materials for Industry, Thin Solid Film, 118:61-71 (1984).
Smith, Thin Film Deposition, McGraw-Hill Inc., pp. 185-196, 278-293. (1995).
Sze, VLSI Technology, 2nd Edition, pp. 9-101, (1988).
Tate et al., Defect Reduction of Bonded SOI Wafers by Post Anneal Process in H/sub 2/Ambient, Proceedings of 1998 IEEE Int. SOI Conference pp. 141-142 from conference held Oct. 5-8, 1998.
Thompson, Strained Silicon MOSFETs: The Next Material Change to Extend Moore's Law, University of Florida, Spring MRS 2004.
Tong et al., A Smarter-cut approach to low temperature silicon layer transfer, Appl. Phys. Lett., 72(1): 49-51 (1998).
Tong et al., Semiconductor Wafer Bonding: Science and Technology, John Wiley & Sons, Inc., pp. 152-171 (1999).
U.S. Dept. of Energy, The Fusion Connection, Plasma Coating,(1985).
Veldkamp et al., Binary Optics, Scientific American, pp. 50-55 (May 1992).
Weldon et al., On the Mechanism of the Hydrogen-Induced Exfoliation of Silicon, J. Vac. Science Tech. B, 15(4), Jul./Aug. 1997.
Wolf et al., Silicon Processing for the VLSI Era vol. 1—Process Technology, pp. 547-549, 1986 by Lattice Press, Sunset Beach, California, ISBN 0-961672-3-7, Reprinted with corrections Jun. 1987.
Wolf et al., Silicon Processing for the VLSI Era vol. 1—Process Technology, p. 139, 1986 by Lattice Press, Sunset Beach, California, ISBN 0-961672-3-7, Reprinted with corrections Jun. 1987.
Wolf, Silicon Processing for the VLSI Era vol. 2, pp. 66-79, Lattice Press (1990).
Wu et al., From Incident Laser Pulse to Residual Stress: A Complete and Self-closed Model for Laser Shock Peening, Feb. 2007. ,Journal of Manufacturing Science & Engineering, vol. 129, pp. 117-125.
Wu et al., Two dimensional hydrodynamic simulation of high pressures induced by high power nanosecond laser-matter interactions under water, Journal of Applied Physics, vol. 101, Issue 10, pp. 103514-103514-8 (2007).
Yaguchi et al., Strain Relaxation in MBE-Grown SI1-SGEX/SU (100) Heterostructures by Annealing, Japanese Journal of Applied Physics, Tokyo, JP, v. 30, No. 8B Part 2, Aug. 1991, pp. L1450-L1453.
Yamada et al., Thermal Damage of Silicon Wafer in Thermal Cleaving Process With Pulsed Laser and CW Laser, Laser-based Micropackaging, edited by Friedrich G. Bachmann, Willem Hoving, Yongfeng Lu, Kunihiko Washio, Proc. of SPIE vol. 6107, 61070H, (2006).
Yang et al., High Performance CMOS Fabricated on Hybrid Substrate with Different Crystal Orientations, IEDM Tech. Dig., 2003, pp. 453-456.
Yang et al., On the Integration of CMOS with Hybrid Crystal Orientations, 2004 Symposium on VLSI Technology Digest of Technical Papers, 2004.
Yun et al., Study on the Etching Reaction of Silicon with Carbon Tetrafluoride in Electron Cyclotron Resonance Plasma Etching System, Journal of the Korean Institute of Chemical Engineers, Jun. 1993, pp. 255-262, Hwahak Konghak vol. 32, No. 3.
Zhang et al., Microscale Laser Shock Peening of Thin Films, Part 1: Experiment, Modeling and Simulation, vol. 126, No. 1, Feb. 2004, pp. 10-17.
Zheng et al., Orientation dependence of blistering in H-implanted Si, Department of Electrical and Computer Engineering, University of California, San Diego, La Jolla, California 92093-0407 , J. Appl. Phys. 89, 2972 (2001).

\* cited by examiner

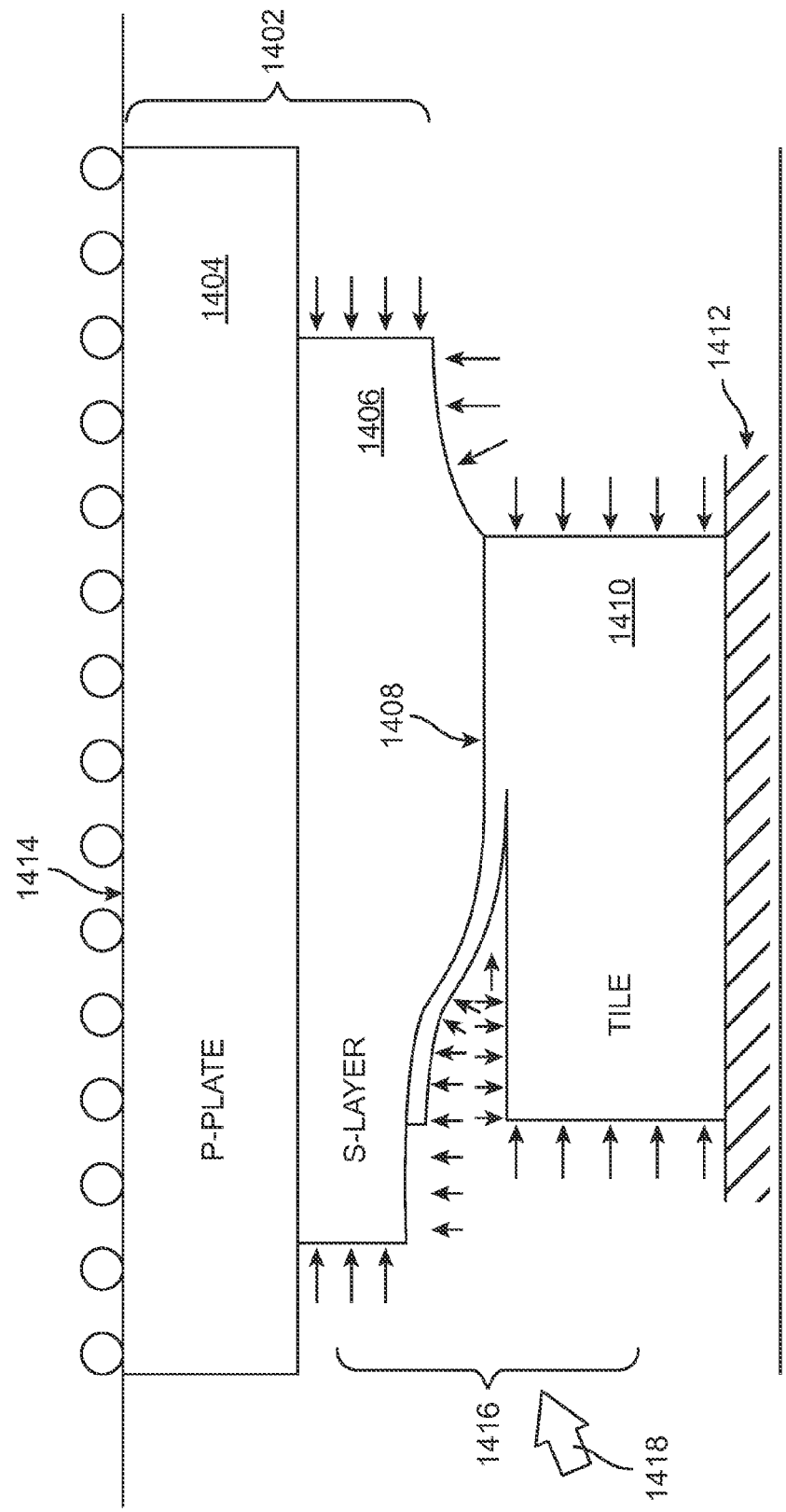

SUBSTRATE CLEAVING UNDER CONTROLLED STRESS CONDITIONS

CROSS-REFERENCES TO RELATED APPLICATIONS

The instant nonprovisional patent application claims priority to and is a continuation of U.S. patent application Ser. No. 14/618,940 filed Feb. 10, 2015, which claims priority to and is a divisional of U.S. patent application Ser. No. 13/225,172, filed on Sep. 2, 2011, which is a continuation-in-part of U.S. Nonprovisional patent application Ser. No. 12/730,113 filed Mar. 23, 2010, which is a continuation of U.S. Nonprovisional patent application Ser. No. 11/852,088 filed Sep. 7, 2007, which claims priority to U.S. Provisional Patent Application No. 60/825,095 filed Sep. 8, 2006. U.S. patent application Ser. No. 13/225,172, filed on Sep. 2, 2011 is also a continuation-in-part of U.S. Nonprovisional patent application Ser. No. 12/435,230 filed May 4, 2009, which claims priority to U.S. Provisional Patent Application No. 61/051,307 filed May 7, 2008. U.S. patent application Ser. No. 13/225,172, filed on Sep. 2, 2011 is also a continuation-in-part of U.S. Nonprovisional patent application Ser. No. 12/460,898 filed Jul. 24, 2009, which claims priority to U.S. Provisional Patent Application No. 61/092,683 filed Aug. 28, 2008. Each of these patent applications is incorporated by reference in its entirety herein for all purposes.

BACKGROUND OF THE INVENTION

Embodiments in accordance with the present invention relate generally to techniques including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have led to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystal structure is less efficient than the more expensive bulk silicon cells made from single-crystal silicon substrates. These and other limitations can be found throughout the present specification and more particularly below.

From the above, it is seen that a technique for manufacturing large substrates which is cost effective and efficient is desirable.

BRIEF SUMMARY OF THE INVENTION

A thickness of material may be detached from a substrate along a cleave plane, utilizing a cleaving process controlled by a releasable constraint plate. In some embodiments this constraint plate may comprise a plate that can couple side forces (the "P-plate") and a thin, softer compliant layer (the "S-layer") situated between the P-plate and the substrate. In certain embodiments a porous surface within the releasable constraint plate and in contact to the substrate, allows the constraint plate to be secured to the substrate via a first pressure differential.

Application of a combination of a second pressure differential within a pre-existing cleaved portion, and a linear force to a side of the releasable constraint plate bound to the substrate, generates loading that results in controlled cleaving along the cleave plane. In some embodiments, the linear force is generated by a piezoelectric, motorized linear actuator or pneumatic element that is in physical contact with a side of the constraint plate through an armature. The magnitude and characteristic of the resulting loading can be determined by factors such as stiffness and thickness of the plate and the compliant layer. In certain embodiments, the choice of material property and/or plate dimension can allow use of a single material to act as the P-plate and S-layer combined.

BRIEF DESCRIPTION OF THE DRAWINGS

FIG. 14A shows a simplified schematic view of an embodiment of a releasable constraint plate.

DETAILED DESCRIPTION OF THE INVENTION

According to some embodiments, techniques directed to the manufacture of photovoltaic materials are provided. More particularly, techniques are provided including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezo-electronic devices, flat panel displays, microelectromechanical systems ("MEMS"), nano-technology structures, sensors, actuators, integrated circuits, biological and biomedical devices, and the like.

A method of manufacturing a photovoltaic layer on a semiconductor substrate is briefly outlined below.

1. Provide a semiconductor substrate, which has a surface region characterized by a tile configuration, a cleave region and a first thickness of material to be removed between the surface region and the cleave region;

2. Initiate a controlled cleaving action on a portion of the cleave region using cleave initiation technologies;

3. Cleave the semiconductor substrate to remove a first thickness of material from the semiconductor substrate as a free-standing film using cleave propagation technologies;

4. Optionally, form a second thickness of semiconductor material overlying the cleaved surface region to form a resulting thickness of semiconductor material, which has one or more photovoltaic regions;

5. Form a solar cell from at least the first thickness of material; and

6. Perform other steps, as desired.

The above sequence of steps provides a method according to an embodiment. As shown, the technique includes a method and a structure for forming a solar cell structure using layer transfer techniques for photovoltaic applications. Alternatives can be provided where steps are added, one or more steps are removed, or one or more steps are provided in a different sequence. For example, the thickening formation step 4 above can be performed before or after the cleave plane formation step 1. In accordance with alternative embodiments, some or all or solar cell formation step 5 above can be performed at any time.

In certain embodiments, the handle substrate can be any homogeneous, graded, or multilayered material, or any combination of these. That is, the handle substrate can be made of a monocrystalline, polycrystalline, or even amorphous type substrate. The substrate can be made of SiC. Additionally, the substrate can be made of III/V materials such as gallium arsenide, gallium nitride (GaN), and others. Additionally, the substrate can be silicon carbide, germanium, silicon, glass or quartz combinations, plastics, and polymers, which have characteristics allowing layer cleaving or separation.

Figure 1:
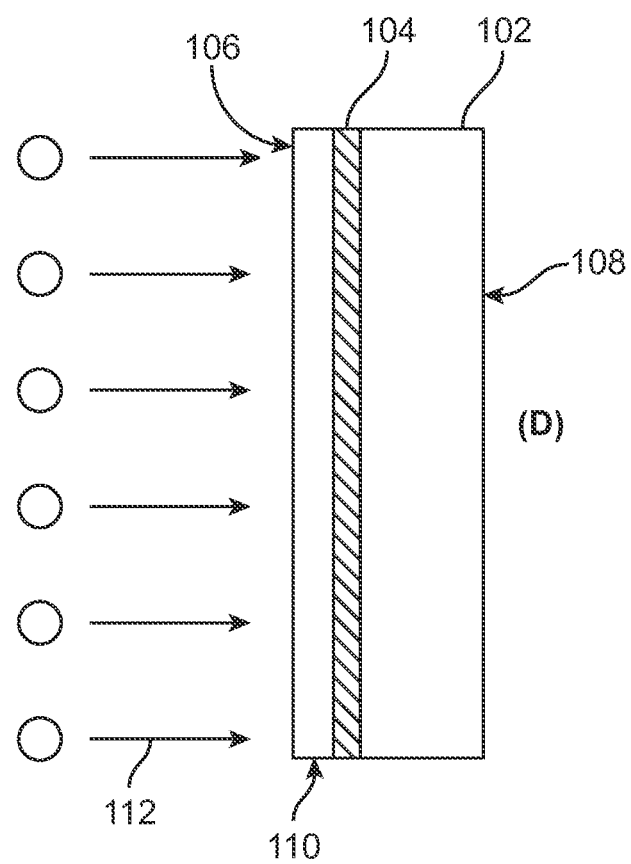
FIG. 1 shows introduction of energetic particles using an implant process through a top surface of a donor substrate to a selected depth.

As shown in FIG. 1, the method includes providing a donor substrate 102 comprising a cleave region 104, a face 106, a backside 108, and a thickness of silicon bearing material 110 between the face and the cleave region. As merely an example, the donor substrate can be a silicon wafer, GaN, a germanium wafer, silicon germanium materials, silicon carbide bearing materials, Group III/V compounds, any combination of these, and others. In a preferred embodiment, the donor substrate can be a photosensitive material. Of course there can be other variations, modifications, and alternatives.

The type of material selected for the donor substrate may depend upon a particular application. For example, where the donor substrate comprises single crystal silicon material, the orientation of the surface may be selected to be (100), (110), or (111). Alternatively, these surfaces can be said to have a normal to surface direction in the <100>, <110>, and <111> direction respectively where the term "direction" refers to this normal to surface terminology unless specifically described otherwise. A single crystal silicon substrate having a (100) surface orientation is a more commonly grown orientation in certain industries such as the solar cell industry, however this orientation has planes that can be more susceptible to unwanted out-of-plane cracking extending into the substrate during the cleaving process.

For purposes of the instant application, out of plane cracking refers to cleave failure mechanisms where the propagating cleave direction moves away from the desired cleave plane. One such mechanism is called "branching" where the cleave plane shifts to another major crystal orientation such as (111). Another cleave failure mechanism is the undesirable change in direction, roughness or depth of the propagating cleave caused by shear stresses. For single crystal cleave applications, these cleave failures are to be avoided using a selection of appropriate starting material orientation coupled with appropriate implant and cleaving techniques as are taught in this application.

By contrast to a single crystal silicon substrate having a (100) surface orientation, a single crystal silicon substrate having a (110) surface orientation may have different getter site and defect region interactions with the implant particles. With hydrogen as the implant specie for example, (110) surface orientation has slower hydrogen detrapping and a higher cleave layer compressive stress profile. However, single crystal silicon (110) are cleaving planes that propagate with less potential of branching than (100) and can desirably result in less out-of-plane cracking extending into the substrate during the cleaving process.

In accordance with still other embodiments, a single crystal silicon donor substrate having a (111) surface orientation may be used. Such a configuration offers a lower cleaving energy and a resistance to cleaving failure and branching that can be exhibited by single crystal silicon with faces oriented along (100) or (110).

Other characteristics of single crystal silicon can also influence the choice of donor substrate material. For example, certain applications may utilize a single crystal silicon donor substrate created utilizing Czochralski (CZ) growth. Other applications may utilize a single crystal silicon donor substrate created by a float zone (FZ) growth method.

The choice of crystallization may also include multicrystalline material that are cast in bulk and thus can be made less expensively than its single-crystal counterpart. Although perhaps not exhibiting as high efficiency as may be characteristic of single-crystal materials, such cast multicrystalline material can yield acceptable solar cell conversion efficiencies in certain applications and would benefit from the less expensive manufacturing methods. Multicrystalline or quasi-single crystalline materials could be cleaved with appropriate implant and cleaving techniques.

Depending upon the embodiment, the cleave region can be formed using a variety of techniques. That is, the cleave region can be formed using any suitable combination of implanted particles, deposited layers, diffused materials, patterned regions, and other techniques. Referring to FIG. 1, the method introduces certain energetic particles using an implant process 112 through a top surface of a donor substrate to a selected depth, which defines a thickness of the material region, termed the "thin film" of material. A variety of techniques can be used to implant the energetic particles into the silicon wafer. These techniques include ion implantation using, for example, beam line ion implantation equipment manufactured from companies such as Applied Materials, Inc. and others. Alternatively, implantation occurs using a plasma immersion ion implantation ("PIII") technique, ion shower, and other mass and non-mass specific techniques. Combination of such techniques may also be used. Of course, techniques used depend upon the application.

Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral and or charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $1 \times 10^{15}$ to about $1 \times 10^{18}$ atoms/cm$^2$, and preferably the dose is greater than about $1 \times 10^{16}$ atoms/cm$^2$. Implantation energy ranges from about 1 KeV to a few MeV, and is generally about 50 KeV for the formation of thin films useful for semiconductor applications.

Implantation temperature ranges from about 20 to about 600 Degrees Celsius. The average temperature during the implantation step may be less than about 400 Degrees Celsius to avoid a possibility of a substantial quantity of hydrogen ions from diffusing out of the implanted silicon wafer and annealing the implanted damage and stress.

In high power scanning implantation, the average temperature may be kept within the above guidelines while the instantaneous silicon surface temperature may be much higher (even exceeding 1000° C.). This can be accomplished, for example, by selecting one or more specific implant parameters including but not limited to beam size, power, beam velocity and repetition rate, to optimize the cleavability (a measure of its ability to initiate or guide a fracture) within the implanted cleave region.

The hydrogen ions can be selectively introduced into the silicon wafer to the selected depth at an accuracy of about +/−0.03 to +/−1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using a Monte Carlo simulation program such as for example SRIM 2003 (Stopping Range In Matter, http://www.srim.org/). In a specific embodiment, the silicon film thickness ranges from about 13 nm to about 3 um using proton implant energy ranges from about 10 keV to about 300 keV. Such a silicon film thickness can be suitable for a template for a epitaxial thickening process (e.g., homoepitaxial growth process or a heteroepitaxial growth process) for subsequent solar cell formation. Of course there can be other variations, modifications, and alternatives.

In a specific embodiment, silicon film thickness ranges from about 1 um to about 50 um can be achieved by using a proton implant energy ranges from about 120 keV to about 2 MeV. The silicon film in this thickness range can be detached to provide a thickness of a single-crystal silicon film of sufficient thickness to form a thin-film solar cell directly with good efficiency. That is, the thickness range of single crystal silicon formed does not need to be further thickened to be used as an efficient light absorber layer in solar cell application. Techniques to maximize thin-film silicon solar cell efficiencies such as front/back contact formation, use of two-sided access manufacturing and light scattering layers to trap more light within the thin-film light absorber layer have been well developed and can be used in combination with this detached layer. Such techniques are well covered, for example, by "Thin-Film Crystalline Silicon Solar Cells—Physics and Technology" by Rolf Brendel (2003 Wiley-VCH Verlag GmbH & Co., KGaA, Weinheim), which is incorporated by reference herein. Of course, there can be other variations, modifications, and alternatives.

In a specific embodiment, a silicon film thickness ranges from about 50 um to about 200 um may be formed using a proton implant having an energy range of about 2 MeV to about 5 MeV. This range of silicon film thickness allows the detachment of a thickness of a single-crystal silicon substrate equivalent that can be used as a free standing silicon substrate. Single crystal silicon substrates in the thickness range of 50 um to 200 um may be used to replace present method of using wafer sawing, etching and polishing processes. As opposed to about 50% kerf loss in the present technologies (kerf loss as being defined as the material lost during the cutting and wafering operations), the implant cleaving technique has virtually no kerf loss resulting in substantial cost savings and material utilization efficiency improvements. Energies higher than 5 MeV may be used to make semiconductor processing alternative substrate materials, but in solar cell manufacturing, 200 um is desired for silicon solar cell material thickness for bulk silicon solar cell formation. As a result, thicker silicon substrates are not of particular commercial interest for fabricating solar cell according to a specific embodiment.

While the above embodiments describe a process in which particles are implanted uniformly across the entire surface of the substrate, this is not required by the present invention. Alternative embodiments in accordance with the present invention can employ a patterned implantation approach, for example wherein a higher dose is implanted at the edge of the substrate, in order to facilitate initiation of the cleaving process at the edge. Inner areas of the substrate may be implanted with lower doses to support propagation of the cleaving that has been initiated at the edge. In accordance with one particular embodiment, all edge portions (not limited to where cleaving is initiated) can be implanted at higher doses in order to pin those edge portions to the cleave plane.

Figure 2:
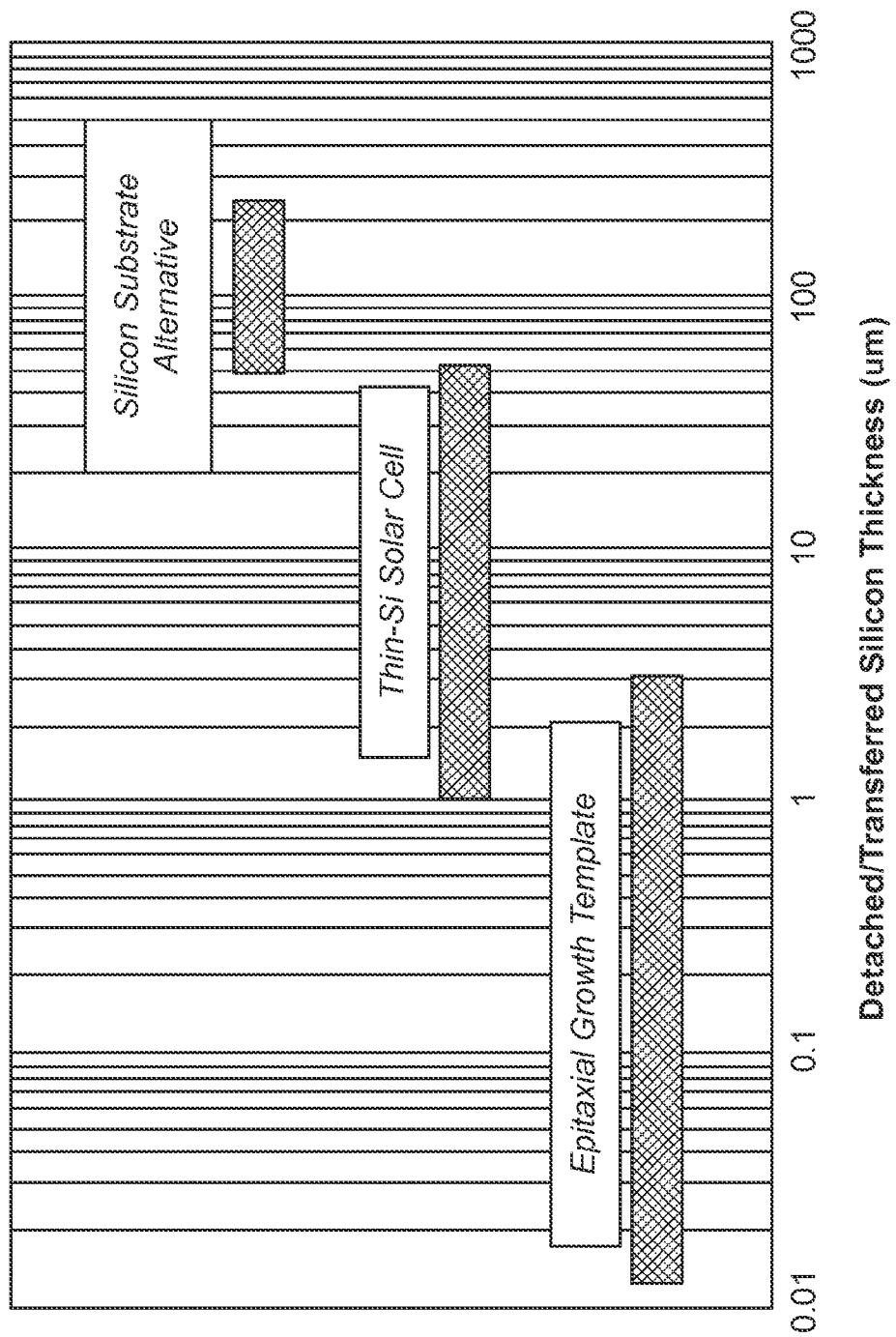
FIG. 2 illustrates ranges of energies and classes of silicon solar cell absorber application in proton implantation

FIG. 2 illustrates ranges of energies and classes of silicon solar cell absorber application in proton implantation. The MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. F. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B 15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 3:
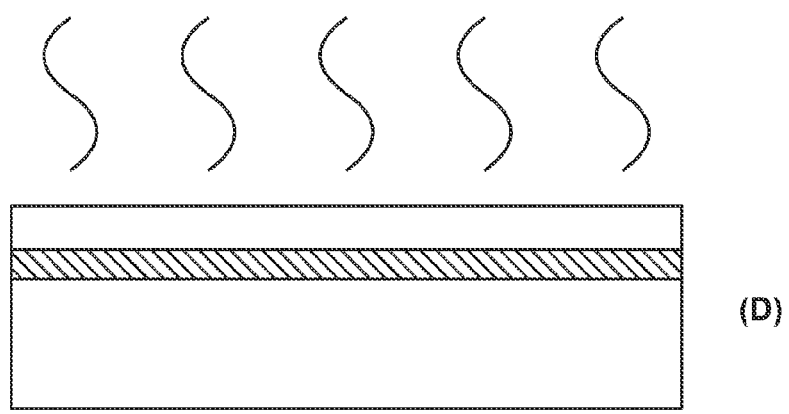
FIG. 3 illustrates a resulting substrate which has been subject to implant.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-detects) in the substrate that can typically at least partially be repaired by subsequent heat treatment, e.g., thermal annealing or rapid thermal annealing. A resulting substrate, which has been subject to implant, is illustrated by the simplified diagram of FIG. 3.

In a specific embodiment, the use of a large-area implanter utilizing plasma-immersion ion implant or ion shower technologies, especially non-mass selected implanters, may co-implant undesirable contaminants through silicon surface. For example, the implantation of iron can substantially lower the effective minority carrier lifetime of the resulting silicon absorber layer and thus cause an undesirable lowering of the light conversion efficiency. Due to the larger implantation range of hydrogen, a screening layer can be provided to prevent iron from entering into the crystalline silicon film. The thickness of the screening layer would depend on the implant energy, the contaminant being screened, and the screen material. Using silicon dioxide as the screening layer and iron as the contaminant as an example, a 300 keV implant would require about 0.3 um of silicon dioxide thickness to completely stop iron from entering a silicon substrate. A 5 MeV hydrogen implant would require a 3.5 um to 4 um thick silicon dioxide layer. The silicon oxide layer can be removed using a chemical strip such as an HF strip or a polishing step, among others. The silicon dioxide layer may also be kept throughout the cell manufacturing process depending on the embodiments. In accordance with still other embodiments, the screening layer can be retained and incorporated into the solar cell in its completed form. Such a screening layer could also be of benefit to mass-selected ion implanters as well.

Of course, there can be other variations, modifications, and alternatives. For example, while the above example describes silicon dioxide as the screening layer, this is not required by the present invention. Other materials, including metal or metal alloy layers and other combinations of materials not limited to dielectric materials, could alternatively be used as screening layers.

If useful to the donor material or its application, the screening layer could also give additional benefits during processing. One example is if the cleaved layer is to be subsequently bonded to a permanent handle substrate, the screening layer can act as a bond promotion layer. Another example is if the donor material is transparent to laser radiation (such as GaN for 970 nm laser diode irradiation), an opaque screening layer can act as a laser surface absorption layer appropriate for inducing laser initiation as taught in this application.

Depending upon the particular embodiment, there may be other techniques for forming a cleave region and/or cleave layer. As merely an example, such cleave region is formed using other processes, such as those called a Nanocleave™ process of Silicon Genesis Corporation of Santa Clara, Calif., a SmartCut™ process of Soitec SA of France, and an Eltran™ process of Canon Inc. of Tokyo, Japan, any like processes, and others. Of course, there may be other variations, modifications, and alternatives.

Figure 4A:
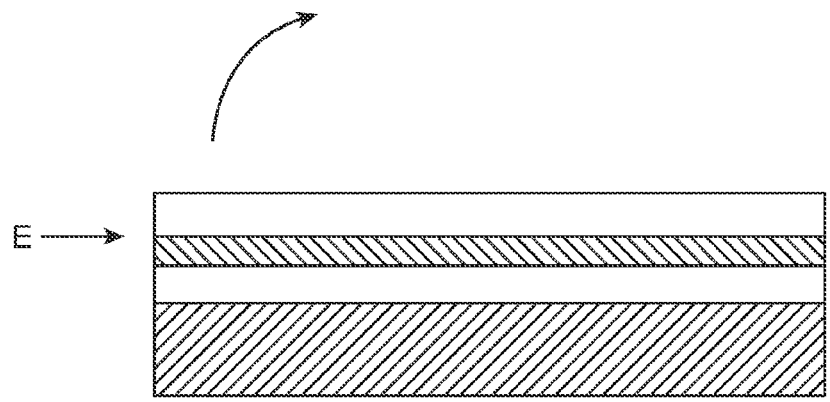
FIGS. 4A-4C shows a method performing a controlled cleaving process on a substrate structure.
Figure 4B:
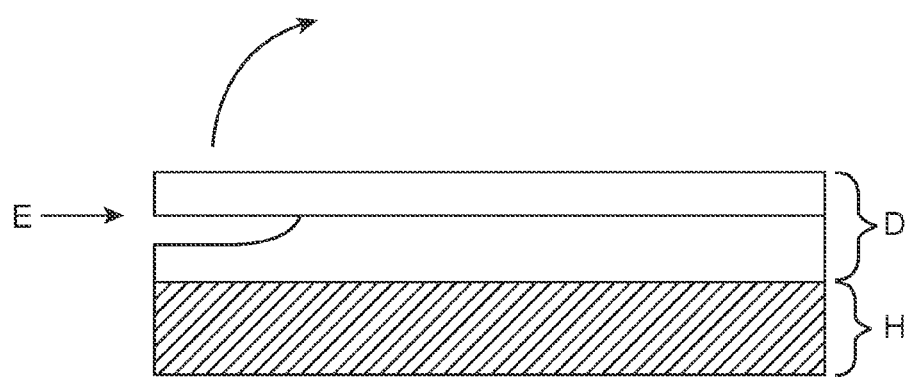
Figure 4C:
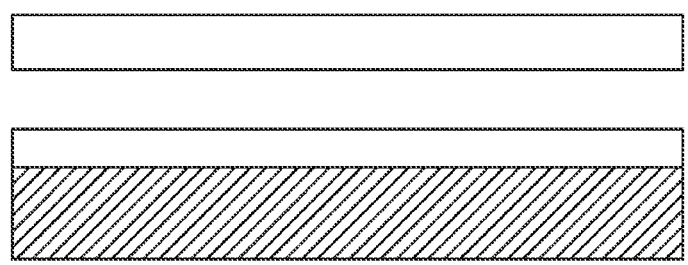

The method performs a controlled cleaving process on the substrate structure, as illustrated by FIGS. 4A-C. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes.

In accordance with certain embodiments, the controlled cleaving process may employ the application of thermal energy for initiation. For example, in the particular embodiment shown in FIG. 5, a beam of thermal energy 500 (such as a laser beam) may be applied to the surface 502 of the substrate 504 having a subsurface cleave plane 506 comprised of an implanted cleave region. According to an embodiment of the invention, the implanted region is part of a higher dose patterned implant to allow efficient initiation to occur. The temperature gradient along the direction of the cleave plane between the localized heated silicon and the adjacent cooler silicon areas, imparts fracture stress (which can be tensile stresses and others) to the silicon. This fracture stress in turn gives rise to cleaving along the direction of the cleave plane resulting in the formation of an initiation area.

Figure 5:
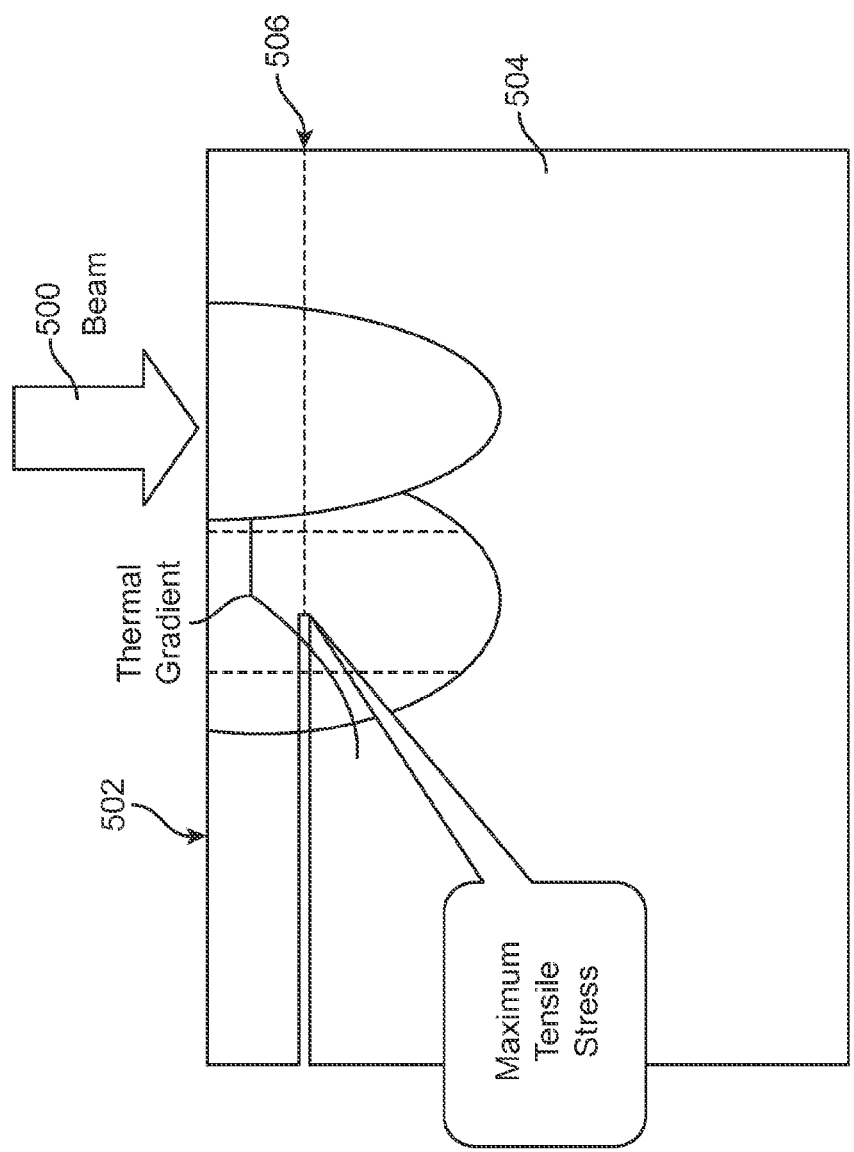
FIG. 5 shows a controlled cleaving process employing the application of thermal energy for initiation.

While the particular embodiment shown in FIG. 5 shows cleaving caused by a laser beam, this is not required. In accordance with alternative embodiments, thermal energy could be imparted to the cleave plane by another type of beam such as electric induction or microwave irradiation. For example, in one embodiment the thermal energy could be imparted by a beam of particles (such as ions or electrons) impacting the substrate. In one particular embodiment, the particles of this beam could comprise the same particles that are implanted to create the gettering sites or defect regions of the cleave plane.

The localized heating of the silicon shown in FIG. 5 also gives rise to a temperature gradient in the vertical direction orthogonal to the direction of the cleave plane. And, owing at least to 1) the smaller volume of silicon overlying the cleave plane, and 2) the directional source of the thermal beam, this vertical temperature gradient is asymmetrical, being steepest in the direction leading toward the surface of the substrate. Such an asymmetrical temperature gradient can impart an unwanted vertical directionality to the resulting tensile force and resulting cleaving action unless the configuration is optimized, for example by positioning the beam source sufficiently ahead of the crack front that this thermal profile asymmetry is largely cancelled.

While the embodiment of the present invention shown in FIG. 5 utilizes a locally applied beam of thermal energy, this is not required. In accordance with other embodiments of the present invention, thermal energy generated by pulsed flash-lamp sources for example could be globally applied to the surface of the substrate in order to induce the vertical temperature gradient and shear force across the cleave plane that gives rise to the controlled cleaving that preferentially causes the higher dose regions to cleave, thus forming the initiation region.

Moreover, while the embodiment shown in FIG. 5 utilizes thermal energy in performing the controlled cleaving process, this is not required. In accordance with alternative embodiments, the application of energy other than thermal energy can give rise to cleaving along a cleave plane.

For purposes of the following disclosure, a "free standing film" or "free standing layer" is defined as a film of material that can maintain its structural integrity (i.e., not crumble or break apart), without being in contact with a supporting member such as a handle or transfer substrate. Typically, very thin films (for example silicon films thinner than about 5 um) are unable to be handled without breaking. Conventionally, such thin films are manipulated using a supporting structure, which may also be needed to create the thin film in the first place. Handling of thicker films (i.e. silicon films having a thickness of between 20-50 um) may be facilitated by the use of a support, but such a support is not mandatory. Accordingly embodiments of the present invention relate the fabrication of free standing films of silicon having a thickness of greater than about 10 um.

The method next frees the thickness of material from the donor substrate to completely remove the thickness of material from the donor substrate, as shown by FIG. 4C. Depending on embodiment, the method of detaching the film is a function of the thickness of the film and its ability to be handled or processed without being attached to a supporting substrate, temporarily or permanently. For very thin-films used for epitaxial template growth for example, the transfer of the film onto a temporary or permanent substrate is necessary to avoid damaging the film. For material film thicknesses exceeding about 50 um, the films may be handled in a free standing manner to be used, for example, in the manufacture of solar cells. A temporary supporting substrate for films of about 3 um to about 50 um for crystalline solar cell applications would be useful to access and process both sides of the detached silicon thin-film to optimize the resulting photovoltaic device. Permanent bonding and transfer of the detached silicon thin-film onto a permanent substrate may have benefit in simplifying the film handling process. Pre-processing of the donor surface prior to or after the implantation step, such as surface texturing, maximizing surface reflective properties, passivation, contact formation, and surface doping, may allow process to this surface to eliminate the need of a temporary supporting substrate. Of course, the choice of the supporting substrate and manufacturing process flow depends on the application and the photovoltaic cell structure.

In a specific embodiment, the method can also thicken the thickness of transferred material using a deposition process. In a specific embodiment, the method uses a solid phase epitaxial process and/or other forms of deposition processes. The process can form a suitable single crystal silicon or like material according to a specific embodiment. As merely an example, the material can be amorphous silicon, polycrystalline silicon, germanium and silicon germanium alloy. For example, amorphous silicon could advantageously allow for solid-phase epitaxial growth of single-crystal silicon using the underlying transferred silicon film as a template. Another method that can increase the effective rate of silicon material deposition is to spray or coat the surface with silicon nanoparticles (advantageously amorphous silicon) which can be thermally treated to produce single-crystal silicon using the underlying transferred silicon film as a template. This can be applied dry or using a liquid that would be eliminated during subsequent processing. Polycrystalline silicon and other materials may also allow single-crystal regrowth using appropriate treatments such as laser anneals, flash thermal treatments and the like. Of course, there can be other variations, modifications, and alternatives.

In a specific embodiment, the present method includes an etching and/or deposition process (e.g., plasma assisted deposition/etching) that be used before any step of forming photovoltaic regions and/or forming the thickened layer. Depending on specific process conditions, etching methods can smooth or texture the cleaved surface region. The method can use a smoothing process that includes thermal treatment of the cleaved film using a hydrogen and hydrogen chloride containing environment according to a specific embodiment. Alternatively, the etchant can be a chemical bath (e.g., KOH, TMAH) to etch and if desired, texture the cleaved film to a predetermined amount. The etching process can be used to remove hundreds of Angstroms to a few tens of microns of hydrogen damaged silicon, as an example. In a specific embodiment, the etching process can also be preceded by an oxidation process to convert the hydrogen damaged region into oxide, which is later stripped using a buffered oxide etch and/or other suitable etching species. Pursuant to this surface treatment, surface passivation to control carrier surface recombination can be made through one or more of commonly known techniques such as an oxide, silicon nitride, aluminum oxide or silicon carbide film formation, hydrogenation or deposition of a thin amorphous silicon film. The quality of the passivated surface is measured using a surface recombination velocity (SRV in units of cm/sec). Excellent surface passivation would have SRV values of roughly 10-100 cm/sec while cell efficiency degradation of thin-film (5-10 micron) crystalline silicon cells would be dominated by surface passivation for SRV values above 1000 cm/sec. The SRV effect on cell efficiency for thin-film silicon cells are explained in the Brendel reference and in a related paper by Brendel entitled "A Novel Process for Ultra-Thin Monocrystalline Silicon Solar Cells on Glass", 14th European Photovoltaic Solar Energy Conference, Barcelona, Spain, 30 Jun.-4 Jul. 1997, which is hereby incorporated by reference. Of course, there can be other variations, modifications, and alternatives.

In a preferred embodiment, the transferred material is thickened using an amorphous silicon layer. In a preferred embodiment, the amorphous silicon layer is crystallized or the like. In a specific embodiment, the amorphous silicon layer is deposited using application of nanoparticles (e.g., amorphous silicon, crystalline silicon, polysilicon, or combinations of these), which are later subjected to a thermal treatment to cause formation of a sheet of thickened material. Alternatively, the amorphous silicon layer can be formed using physical vapor deposition or chemical vapor deposition (e.g., plasma enhanced) at low temperature according to a specific embodiment.

In a specific embodiment, the resulting film can be a single crystal and/or polycrystalline structure according to a specific embodiment. In preferred embodiments, the resulting film is single crystalline and has suitable electrical characteristics. Of course, there can be other variations, modifications, and alternatives.

Depending upon the embodiment, the thickened material can be subjected to impurities to form the solar cell structures. In a specific embodiment, the impurities can be in-situ doped, diffused, and/or implanted using ion beams, plasma immersion implantation, ion shower, non-mass separated implantation, substantially or partially non-mass separated, or conventional implantation techniques. These solar cell structures can include impurity regions for P-type and N-type impurities according to a specific embodiment. Of course, there can be other variations, modifications, and alternatives.

In a specific embodiment, the method can also form another layer overlying the thickened layer to form the photovoltaic devices. The other layer can be a semiconductor layer, which can be used to enhance the photovoltaic devices provided for the completed solar cell structure, according to a specific embodiment. In an alternative embodiment, the other layer can be germanium, silicon germanium, II/IV, III/V, SiC, GaN, any combination of these, and others. The other layer can be used to form another set of photovoltaic regions, which can be coupled to other photovoltaic devices, to enhance the total photovoltaic intensity. Of course, there can be other variations, modifications, and alternatives.

Depending upon the embodiment, the present method and structure can be formed with a specific thickness of the thickened layer and/or combination of the layer transferred layer and thickened layer. In a specific embodiment, the thickened layer can be between about 1 um and 20 um using a silicon material. In other embodiments, the thickened layer can be less than 1 micron or greater than 20 microns. In other embodiments, the thickened layer can be less than about 50 microns. Of course, there can be other variations, modifications, and alternatives.

Depending on the embodiments, it is to be understood that a specific thickness of material can either be formed using a first transferred layer that is subsequently thickened. Alternatively, the specific thickness can be transferred directly in a sufficient thickness that a further thickening step is not required.

Other layers such as passivation layers, contact layers, diffusion layers, texturing and other light trapping layers, and light reflection or light coupling layers can also be added before the cleave step or on one or both sides of the cleaved film after the cleaving step. For example, dry plasma etch and texturization steps could be applied to one or both surfaces of the substrate at any point in the substrate manufacturing step to prepare the surfaces for optimized solar cell performance (i.e. high light trapping, high quantum efficiency and low surface recombination velocity). The plasma can be excited using inductively-coupled plasma (ICP) or capacitively-coupled plasma discharges of etchant and passivation gasses under an appropriate recipe. For example, the etchant can be fluorine based such as SF6 and for passivation and contamination reduction, an ashing oxygen plasma can be used. Of course, there can be other variations, modifications, and alternatives.

Figure 6:
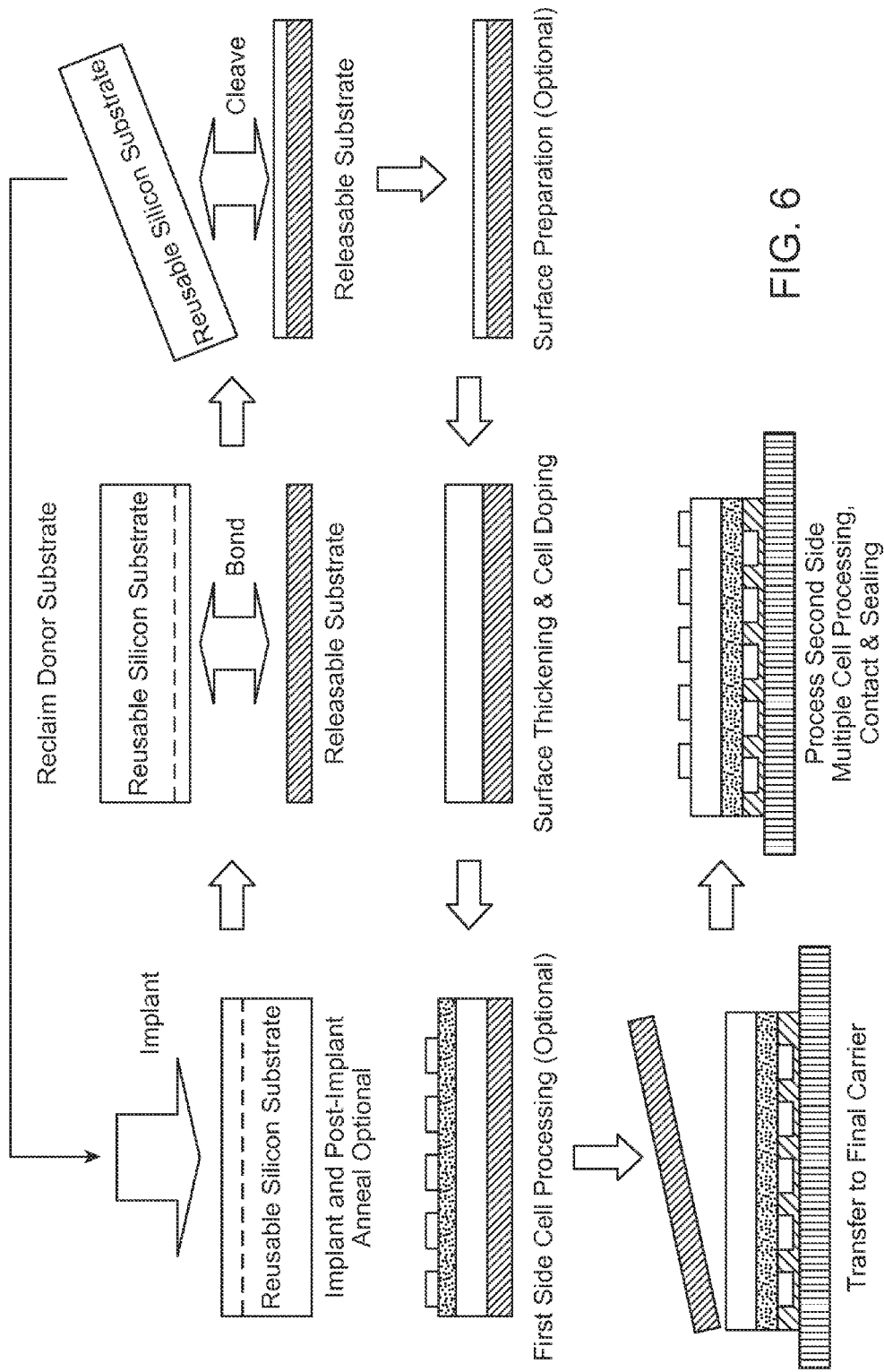
FIGS. 6-8, 8A, and 9 illustrate embodiments of process flows forming solar cells.
Figure 7:
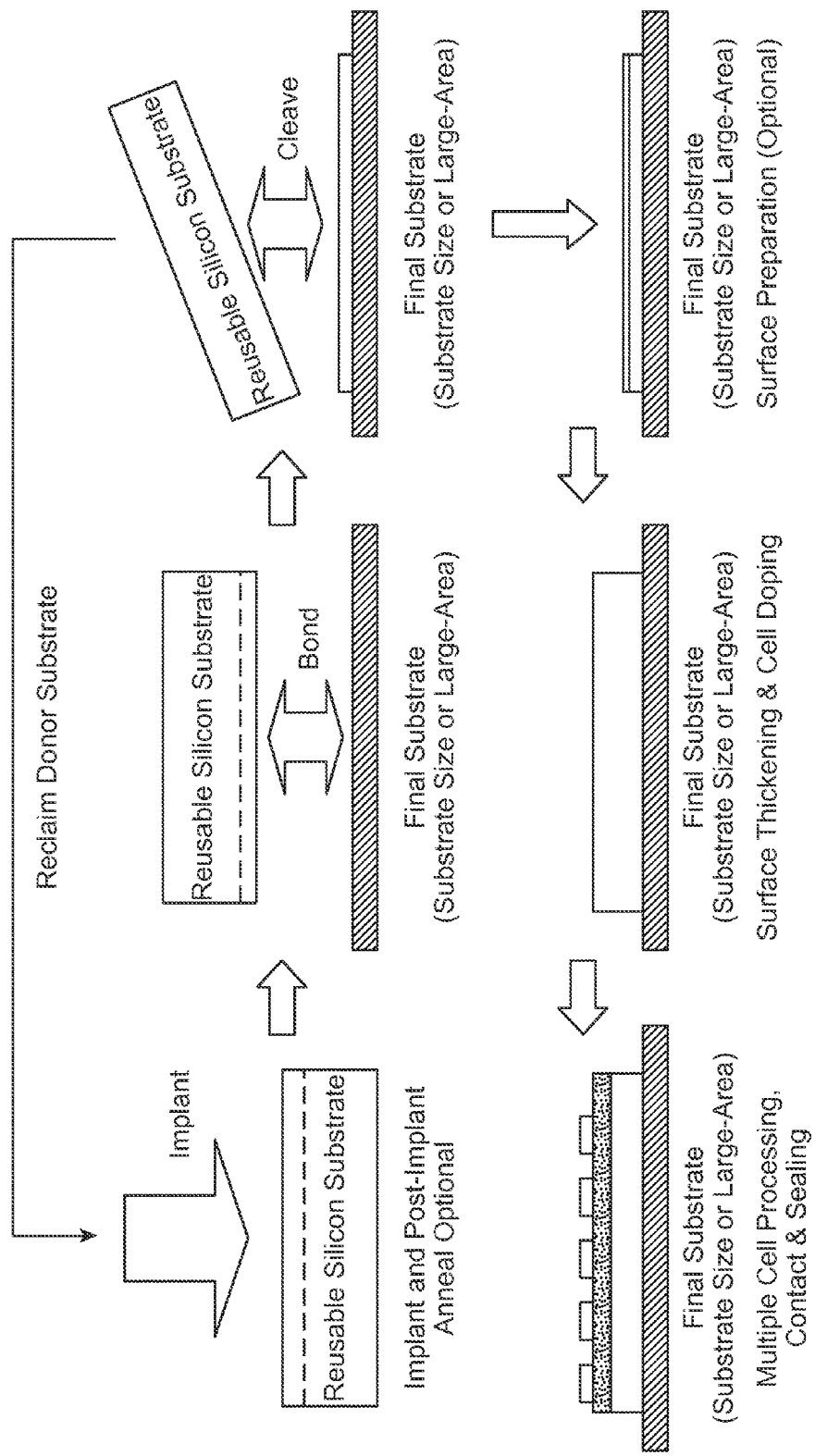

FIGS. 6-8, 8A, and 9 illustrate process flows for forming solar cells according to embodiments of the present invention. As shown, the process flows can be enabled by each of the three major energy ranges to form the thickness of film. FIGS. 6-8, 8A, and 9 are related to the lower energy, growth template use of the transferred film after implant. FIG. 6 shows the use of a temporary, releasable substrate that would allow the process flow to have access to what will become the backside of the solar cell for layer doping, passivation and interconnect processing. Note that the temporary, releasable substrate can be implemented using numerous methods such as a chemically releasable substrate, for example, a thermally, mechanically or chemically releasable tape or rigid substrate. FIG. 7 is a simpler, direct transfer and growth process flow but would have less access to the backside for optimizing solar cell performance and its light conversion efficiency. Of course there can be other variations, modifications, and alternatives.

Figure 8:
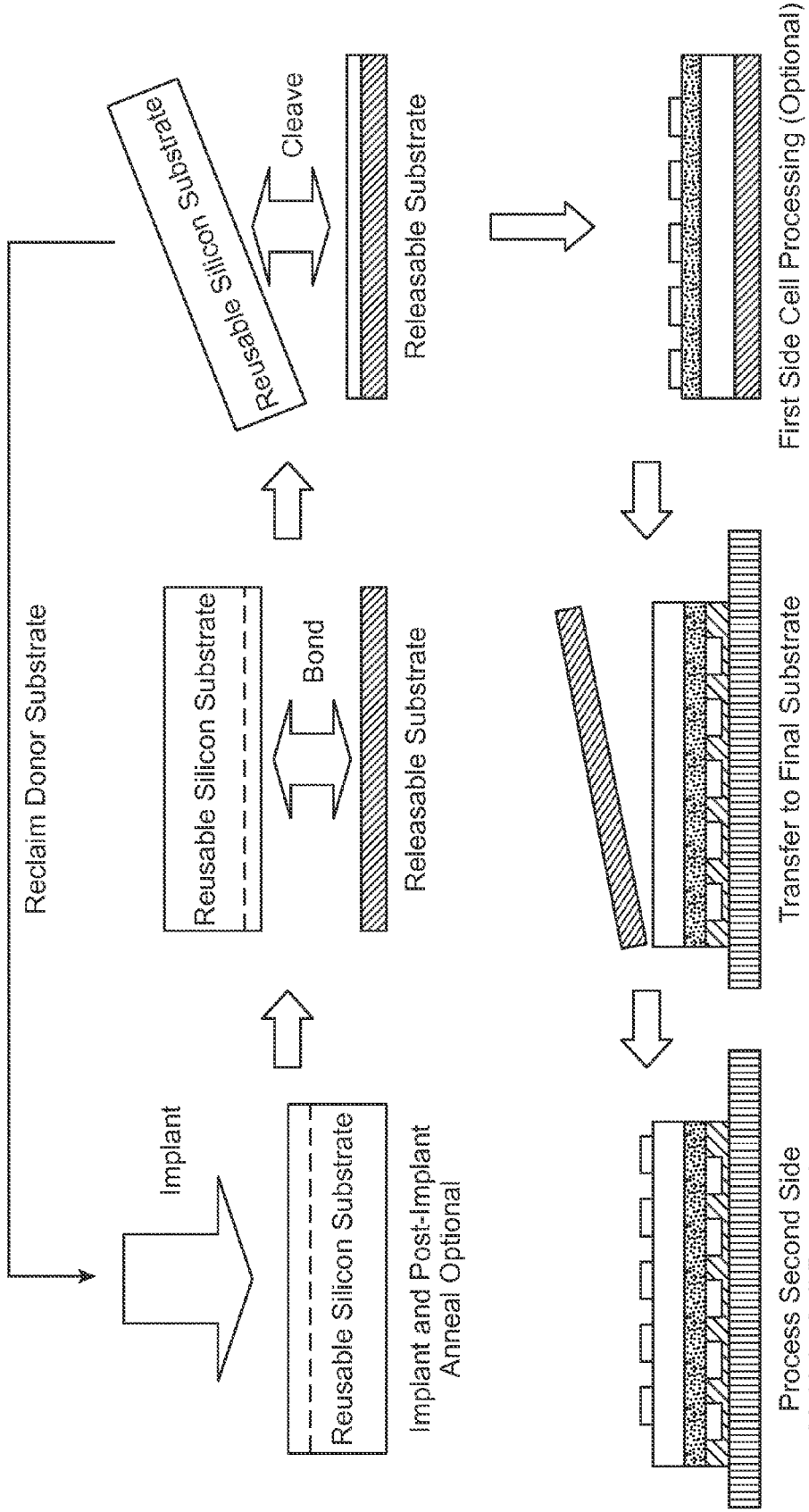
Figure 8A:
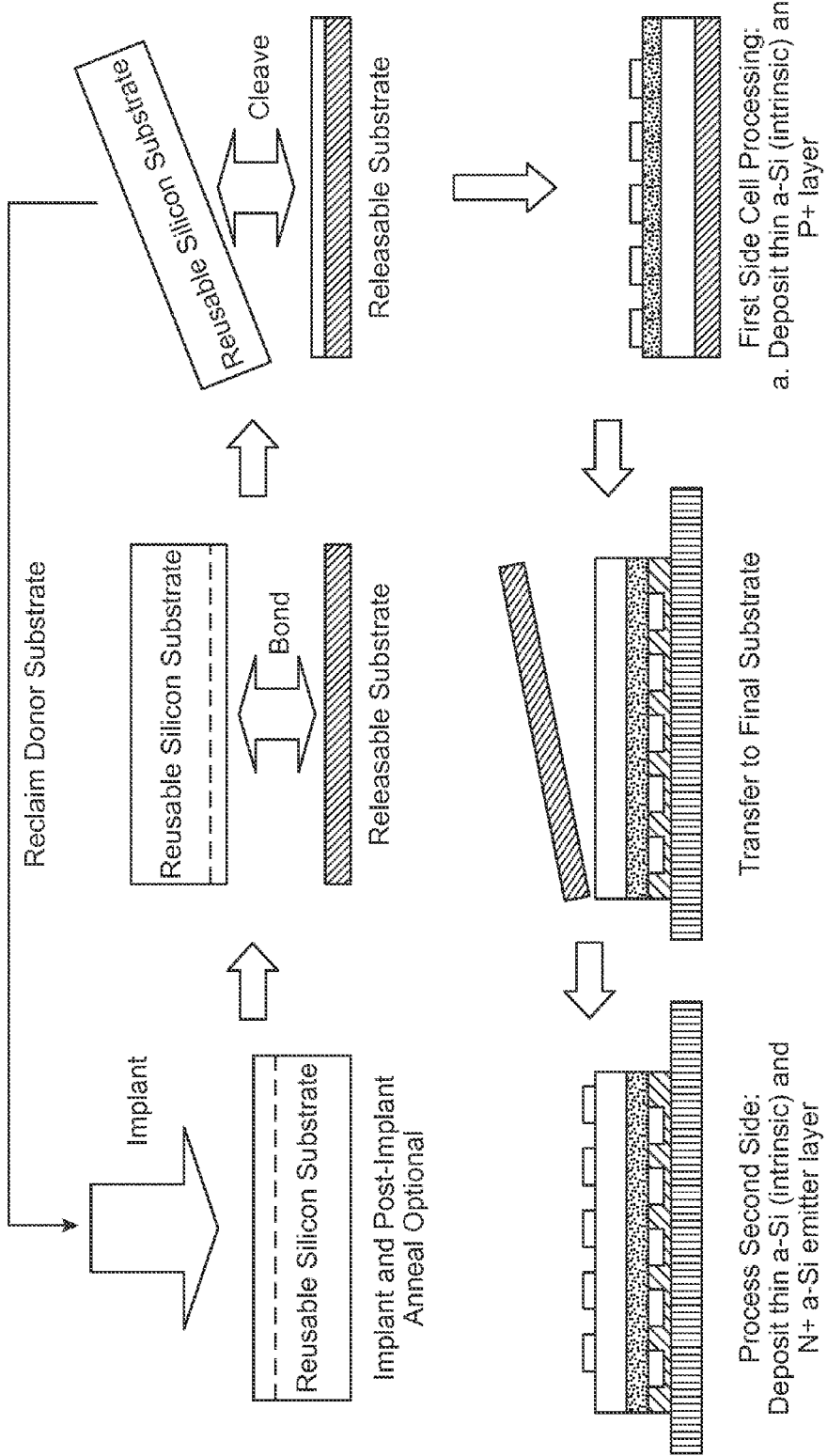
Figure 9:
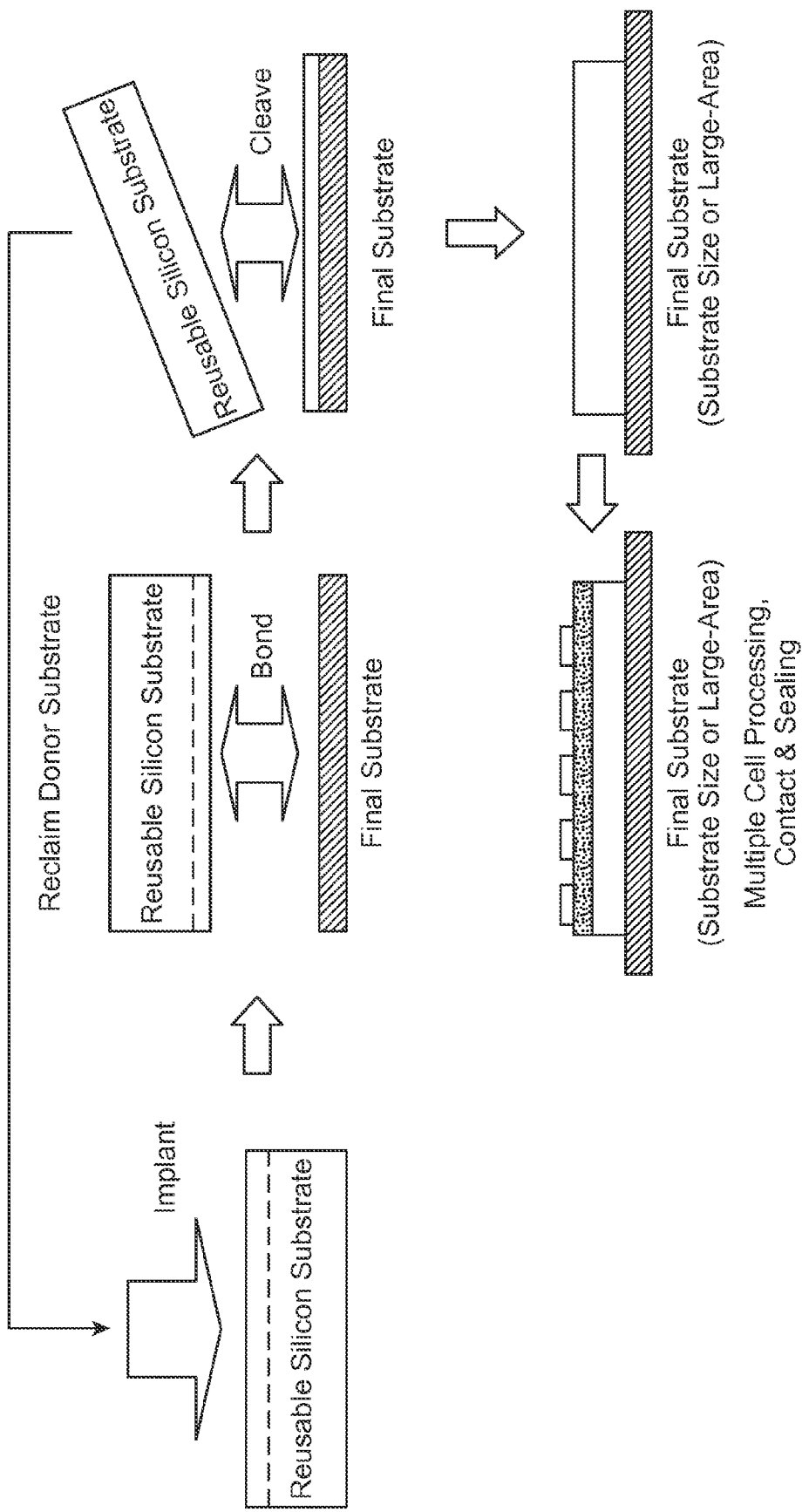

FIGS. 8 and 9 illustrate process flows using a temporary substrate and direct bonding for 1 um to 50 um films formed using an implant process. The major difference in these process flows compared to FIGS. 6 and 7 is the absence of a growth or thickening step. FIG. 8 shows the use of a temporary, releasable substrate that would allow the process flow to have access to what will become the backside of the solar cell for layer doping, passivation and interconnect processing. Note that the temporary, releasable substrate can be implemented using numerous methods such as a chemically releasable substrate such as a thermally, mechanically or chemically releasable tape or rigid substrate. FIG. 8A shows a specific example of the process flow described in FIG. 6 using an amorphous silicon contact and emitter structure. This amorphous (a-Si) thin surface layer has been shown to optimize the absorber passivation and allow better contacting. Since the thin-Si process of FIG. 8 utilizes a temporary substrate, backside access is possible for a-Si contact formation and passivation after the cleaving step. According to this example, the released silicon film having P to P− doping is deposited with a very thin amorphous intrinsic layer (10-30 Angstroms typically) that allows good surface passivation but also can allow current flow through tunneling. The a-Si layer is then doped P+ to serve as the backside contact. The layer is then bonded onto the final substrate. The back contacting can be contacted as shown or can be a continuous transparent or opaque conductive film depending on the specific embodiment. The front side is then passivated with a very thin intrinsic a-Si film and an emitter of N+ doped a-Si then serves as the second contact to the cell. This cell would function well as a high-efficiency cell. A tandem cell made of a-Si could also be deposited over this structure to further enhance efficiency. Of course, the doping or emitter surface choice can be reversed depending on the specific embodiment. FIG. 6 is of a simpler, direct transfer process flow but backside access would be only available prior to the bond step to the permanent substrate. There is therefore less opportunity for access to the backside for optimizing solar cell performance and its light conversion efficiency. The choice of the process flow can also be affected by the cost differences between high-temperature and low-temperature final substrates since the possible need of high-temperature cell processing steps made on the final substrate rather than on a temporary substrate may require a more expensive, high-temperature capable final substrate. Of course there can be other variations, modifications, and alternatives.

Figure 10:
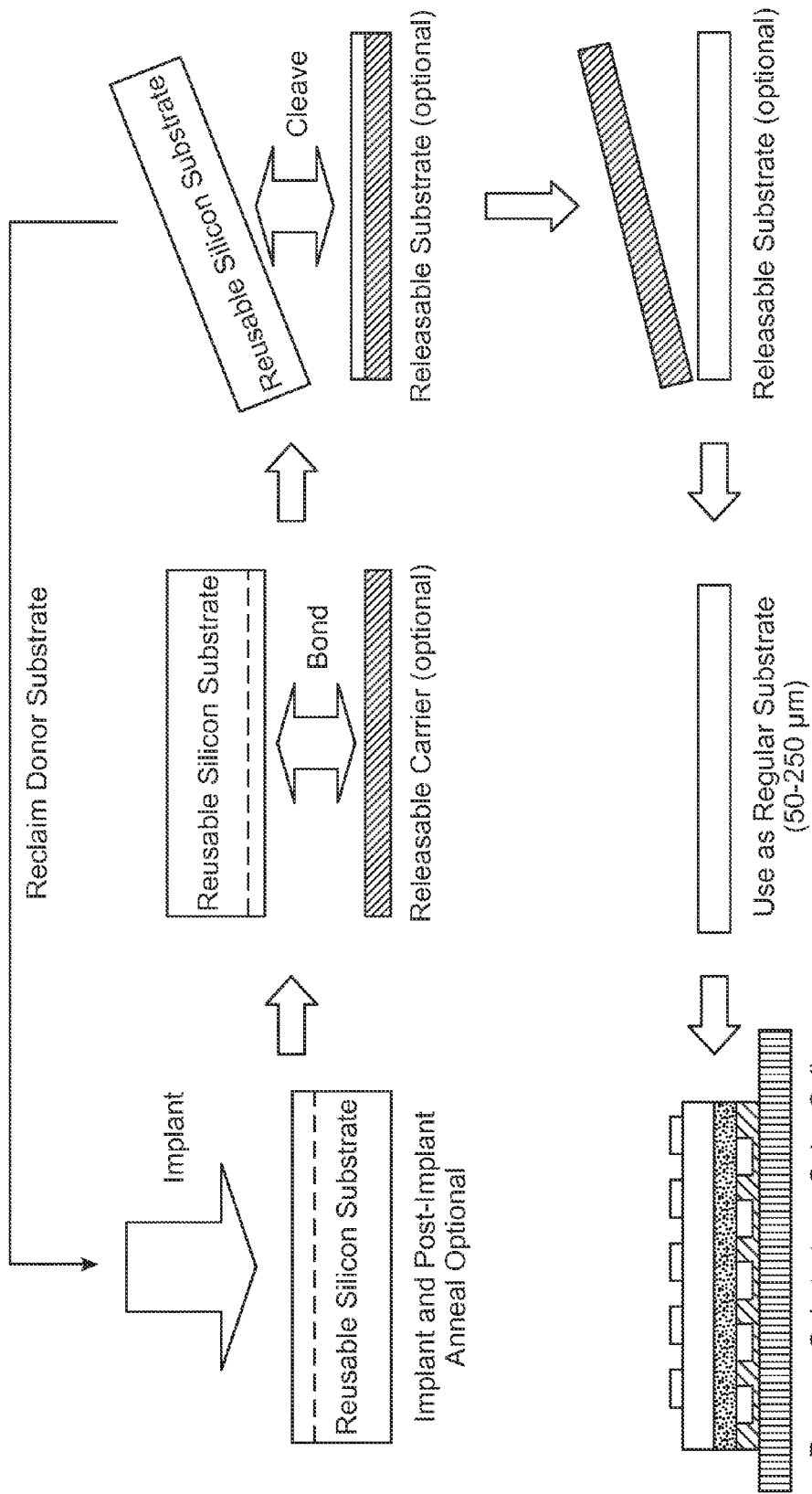
FIG. 10 illustrates an embodiment of a process flow of using a thick silicon film capable of being processed as a free standing substrate.

FIG. 10 illustrates a process flow of using a thick silicon film capable of being processed as a free standing substrate. Of about 20 um to 250 um in thickness, this thick-film can be either detached using a purely thermal process (which may be isothermal) by utilizing one or more of the controlled cleaving techniques mentioned above or using the P-plate/S-layer cleave methods described herein. The detachment can either be done directly as a free standing substrate, or transferred to a temporary, releasable substrate and eventually released for processing the side attached to this temporary substrate. Note that the temporary, releasable substrate can be implemented using numerous methods such as a chemically releasable substrate, for example, a thermally, mechanically or chemically releasable tape or rigid substrate, a vacuum chuck, or an electrostatic chuck. Of course there can be other variations, modifications, and alternatives.

In the above examples that do not include bonding or placement of a releasable substrate, a constraint plate of appropriate hardness may be used during the cleaving process to confine any bending of the film away from its original shape, which might otherwise impart shear stresses that can cause undesired cleave plane branching, film breaks or direction changes. The constraint plate can be in contact with the film, with no adhesive or other forms of attachment needed. Alternatively, the constraint plate can be in close proximity to the film, as defined as a fraction of the film thickness being cleaved. The film would thus be contained to remain in essentially its original shape through the cleaving process while imparting the necessary stresses to cleave the film in a controlled manner.

If the cleaving process includes a thermal beam process using a laser beam for example, front surface access is required. In such a case, the plate can be made from a transparent material (Quartz, Sapphire, etc.). Optionally, this plate can also become the surface that can act as a carrier for the cleaved film if it has electrostatic or vacuum capability.

The growth of silicon based solar cells may rely on driving down a bottleneck for cost in wafering kerf-loss. Traditional sawing, or adopting recently reported wafering technologies (such as multi-wire saw, spark cutting, laser cutting, or plasma cutting) that render thick films suitable for solar cells, may exhibit limited usefulness due to one or more of the following issues: high kerf loss high, slow cutting speed, and lack of manufacturability.

According to particular embodiments of the present invention, cleaving of a film of material may be accomplished with substantially reduced implantation of ions, or possibly no implantation at all, utilizing a cleaving process that carefully controls the three stress intensity modes ($K_I$, $K_{II}$, and $K_{III}$) during the cleaving process. In an embodiment, a film of material may be formed by providing a semiconductor substrate having a surface region, a peripheral region, and a cleave region at a predetermined depth beneath the surface region. For purposes of the instant patent application, the term "cleave region" does not necessarily denote a region that has received radiation or implanted ions, but rather refers to a region that may be separated from the substrate following the application of radiation and/or implanted ions and/or suitable external cleaving energies.

A cleave initiation region may be defined within a portion of the peripheral region and a vicinity of the cleave region. The cleave initiation region may be formed by subjecting the region to a thermal, chemical, electrical, and/or mechanical process to release a section of the film within the initiation region.

In one embodiment, initiation may be accomplished by subjecting the cleave initiation region to a localized thermal treatment, so that a cleave front can be initiated within this region and propagates to the periphery of the initiation region where the thermally induced energy and/or dose is lower and does not promote further propagation. The general film release process can then continue to propagate cleaving of the initiated film from the existing cleave front through the remainder of the substrate.

Figure 11:
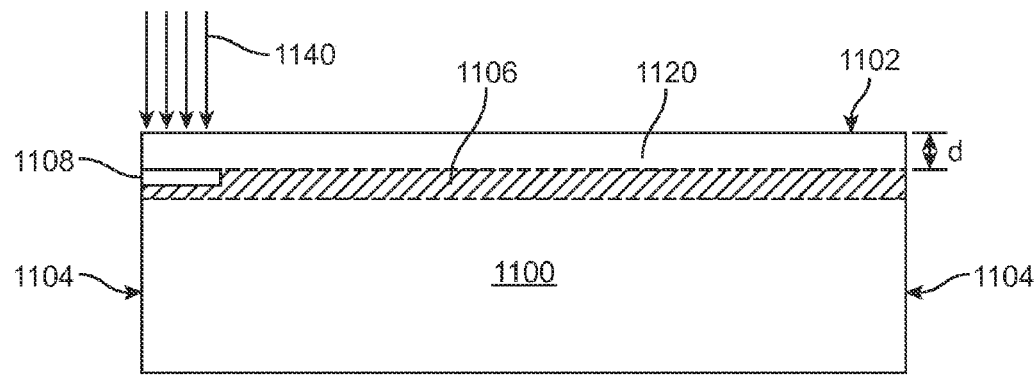
FIG. 11 is a simplified diagram illustrating a side view of a semiconductor substrate having a cleave region at a predetermined depth beneath a surface region.

FIG. 11 is a simplified diagram illustrating a side view of a semiconductor substrate having a cleave region at a predetermined depth beneath a surface region according to an embodiment of the present invention. This diagram is merely an example, which should not unduly limit the scope of the claims herein. One of ordinary skill in the art would recognize many variations, alternatives, and modifications.

As shown in FIG. 11, a semiconductor substrate 1100 is provided having a surface region 1102 and a peripheral region 1104. In addition, a cleave region 1106 is provided. This cleave region is in essence a virtual plane or layer located at a predetermined depth d beneath the surface region 1102, and is used to define a thickness of thick film 1120 to be detached from the semiconductor substrate 1100. In one embodiment, the semiconductor substrate has a thickness substantially larger than the depth d. In a specific embodiment, the semiconductor substrate is single crystal silicon material for use in a photovoltaic solar cell. In a specific embodiment, the silicon substrate has a surface plane that is selectively in a (111) or (110) crystallographic plane (a certain small miscut angle of less than about 1-3 degrees may exist). In a specific embodiment, the cleave region defined is substantially parallel to the surface region. Since the cleaving action is energetically easier along the (111) plane followed by (110) plane than in the traditional (100) plane, it is desirable to orient the material to be cleaved to coincide the surface to be cleaved with a lower surface energy crystallographic cleave plane. More detailed description of techniques for selecting certain orientation of the silicon boule for slicing or cleaving can be found in the U.S. Provisional Patent Application 61/051,344 to Francois J. Henley titled "METHOD AND DEVICE FOR SLICING A SHAPED SILICON INGOT USING LAYER TRANSFER," commonly assigned, and hereby incorporated by reference herein.

FIG. 11 also shows the formation of a cleave initiation region by pattern implanting high energy particles according to an embodiment of the present invention. This diagram is merely an example, which should not unduly limit the scope of the claims herein. One of ordinary skill in the art would recognize many variations, alternatives, and modifications.

As shown in FIG. 11, a portion of the peripheral region 1104 can be associated with a predetermined patterned region (not shown directly in the cross-sectional view of FIG. 11) within the surface region 1102. In one embodiment, the selected portion of the peripheral region is within an edge vicinity of the cleave region 1106.

In a specific embodiment, a patterned region of the surface region 1102 is made by exposing region 1108 to a high energy ion beam 1140, for example H+ ions with energy level of 1 MeV or more using a linear accelerator. In one embodiment, the area of the patterned initiation region is limited to 1-3% of the total substrate surface area (e.g., 2-5 cm² or less for a 125 mm×125 mm sized substrate) to reduce total process dose, thus minimizing energy costs of the system and enhancing productivity of the thick film cleaving process.

The high energy ions are implanted beneath the surface region to reach a region within the vicinity of the cleave region 1106. The penetration depth of the ions is dependent on the energy level, and can be controlled to a desired value that determines a depth d of the cleave region. The implanted ions slow down within the crystal lattice by transferring kinetic energy to the lattice in the form of ionization (electronic braking), and small amount of atomic damage by displacing atoms (nuclear stopping).

During the final phase (about 2-5% of the total range), the ions interact substantially more with the crystal lattice under nuclear stopping, and a thin region of relatively high stress and damages lattice bonds is formed to define a cleave initiation region 1108. As shown, the formed cleave initiation region 1108 is a small planar region extending from a portion of the peripheral region 1104 toward within the cleave region 1106. Since the patterned implantation is performed by irradiating ionic particles within an area less than 1-3% of total area of surface region, this initiation dose can be higher than the propagation dose. This allows the averaged area dose to be maintained low for enhanced productivity. Of course, there can be many alternatives, variations, and modifications.

Propagation Fracture Modes

Figure 12:
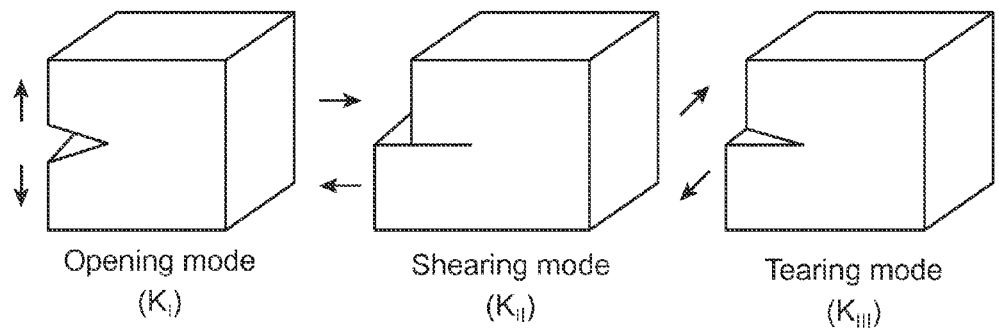
FIG. 12 illustrates fracture modes in propagation of a cleave front through a substrate.

Propagation of a cleave front through a substrate, may be understood as occurring through one or more fracture modes, as are illustrated in FIG. 12. A first fracture mode comprises an opening or tensile mode ($K_I$), where cleaving forces act substantially perpendicular to a direction in which the cleave front is propagating. A second fracture mode comprises a shearing or sliding mode ($K_{II}$), where cleaving forces lie substantially parallel to the direction in which the cleave front is propagating. A third fracture mode comprises a tearing or out-of-plane mode ($K_{III}$), where cleaving forces are substantially out of a plane along which the cleaving is occurring.

The following discussion addresses general Linear Elastic Fracture Mechanics (LEFM) equations that may govern cleaving according to embodiments of the present invention. This analysis assumes a large-area tile, where the film is much thinner than the remainder of the silicon tile.

Figure 13:
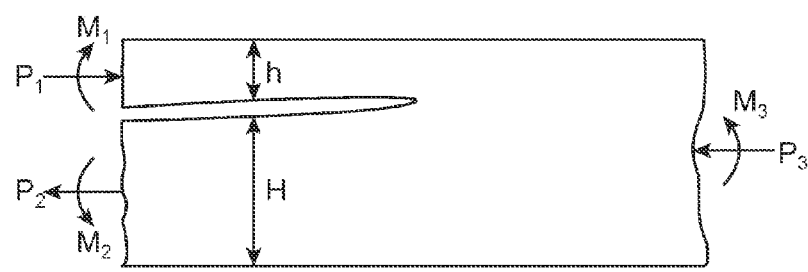
FIG. 13 shows a mechanical configuration following an initiation process.

The mechanical configuration following the initiation process is shown in FIG. 13. Specifically, a thick film of thickness h is partially released from the rest of the silicon ingot substrate having thickness H. Due to the much larger dimensions of the substrate relative to the cleaved material, h<<H and the tile moment and forces M2, P2, and M3, P3 are understood to be very small. The source of stress intensity seen at the crack tip is thus dominated by M1 and P1, the moment and force coupled to the partially released thick film.

A basic concept of embodiments of the present invention is the hydrogen cleave plane. The hydrogen cleave plane (H-plane) affects the cleaving action through stress and layer weakening effects. Specifically, the H-plane can be used both as an initiating layer at higher doses, and as a guiding or propagating layer when the dose is lower. The action of the H-layer is different within these two dosage regimes.

One effect upon cleaving action of the end-of-range (EOR) hydrogen implant layer, is the reduction in fracture strength around the cleave plane. Such reduction in fracture strength can be caused by bond damage and by stress induced by the presence of the hydrogen itself. Both of these considerations can lower the energy needed to create a new surface during cleaving.

The energy needed to create a new surface during cleaving, is hereafter referred to as the surface energy ($\gamma$). In unimplanted single crystal silicon, the surface energy is about 1.2 J/m² for the {111} orientation, although fracture toughness in silicon is sometimes reported as 4-6 J/m² and includes effects such as lattice trapping to give an effective energy to produce a new surface. For the following analysis of silicon at (111) orientation, a surface energy of 1.2 J/m² per surface (2.4 J/m² total) will be assumed.

By contrast, the value of the modified surface energy ($\gamma'$) along an implanted cleave plane can be substantially lower, perhaps by a factor of 5 or more. The surface energy value $\gamma'$ of the effective cleave plane is related to the unimplanted surface energy ($\gamma$) according to the following relation:

$$\gamma' = \alpha_H^2 * \gamma, \text{ where:} \tag{1}$$

$\alpha_H$ is a factor between 0 and 1 that serves to quantify the reduction in cleave energy due to hydrogen embrittlement.

The $\alpha_H$ term accounts for effects necessary to yield an accurate representation of stress and bond damage effects. $\alpha_H$ is experimentally determined as a function of cleave energy, dose, implant thermal conditions, and post-implant thermal conditions.

If the H-dose embrittlement effects are proportional to stress intensity, it may follow that cleave energy is related quadratically to dose as follows. For relatively low doses of less than about $3\text{-}4 \times 10^{16}$ cm$^{-2}$:

$$\alpha_H = 1/(1 + K_H * \phi), \text{ where:} \tag{2}$$

$K_H$ is a constant to be determined experimentally, and $\phi$ is the hydrogen dose.

Substituting equation (2) into equation (1) yields:

$$\gamma' = [1/(1 + K_H * \phi)]^2 * \gamma \tag{3}$$

Since the cleaving energy is a fundamental parameter in linear elastic fracture mechanics, the correlation between implant dose and energy allow accurate prediction and modeling of cleaving action.

Two surfaces are created during the cleaving process. Thus the cleave energy release rate (G') is related to the surface energy as follows:

$$G' = 2 * \gamma' = 2 * \alpha_H^2 * \gamma \tag{4}$$

Depending on the embrittlement factor ($\alpha_H$), G' can change from about 2.4 J/m2 to substantially less within the cleave plane. For example, in an experiment involving a 50 um thick single crystal silicon film, a crack in a cleave plane formed by a H implantation dose of 2-8×10$^{16}$ cm$^{-2}$ showed that for H-doses higher than about 4-6×10$^{16}$ cm$^{-2}$, there is a measurable lowering of the cleave energy ($\alpha_H^2$<1) as measured by a double-cantilever beam mechanical configuration.

Lower cleave energy can have a guiding effect to keep the cleave plane within the weakened layer during propagation. This is because the energy barrier to branching from the cleave plane will be higher if $\alpha_H$ is lower. For example, a high dose implant may result in sufficient lowering of the cleave energy within the implant, that the film may simply peel off of the substrate.

For cleave planes with lower hydrogen doses (less than about 4×10$^{16}$ cm$^{-2}$), it has been experimentally determined that $\alpha_H \approx 1$. With the cleave energy essentially having intrinsic cleave energy values, cleave guiding at lower doses is thus mostly dominated by the implanted hydrogen compressive stress profile that helps keep the cleave front propagating along the cleave plane.

Specifically, a guiding effect is the shear force generated by the in-plane compressive layer that is generated when the cleave front moves away from the center of the compressive stress profile. Deviation of the cleave front depth away from this center point of compressive stress, will tend to generate an in-plane ($K_{II}$) shear force having a polarity that tries to maintain the cleave front propagating parallel to and within the cleave plane over a range of shear stress intensity values (non-zero $K_{II}$).

Thus, if the cleave front starts moving up to the surface, a positive ($K_{II}$) shear force will guide the cleave front lower towards the center. Conversely, if the cleave front starts moving lower into the tile, a negative $K_{II}$ shear force will guide the cleave front higher towards the center.

This phenomenon occurs because any non-zero $K_{II}$ generated during cleaving will tend to guide the fracture plane away from the cleave plane so as to minimize $K_{II}$. This effect can be cancelled to some extent by the shear generated by the cleave layer that is generated in the opposite direction. The result is a net offset in cleave depth that becomes the new cleave depth where $K_{II}$=0.

This slight movement of the cleave depth has been experimentally observed, and the maximum shear that the cleave layer can absorb is related to the compressive stress level present at the cleave plane and the straggle (Rp) of the implant defining the cleave plane. Once the shear stress level is higher than this critical level, the cleave front will jump out of the cleave plane and cleave failure will occur.

It is therefore a potentially important design consideration to have a cleaving configuration that minimizes the induced $K_{II}$ shear forces, in order to allow controlled cleaving at the desired depth with low propagation doses. The effect can be modeled by a capture range of $K_{II}$ stress intensities within which the cleave propagation direction continues to lie parallel and close to the $K_{II} \approx 0$ fracture propagation plane.

The upper and lower limits of $K_{II}$ stress intensity factors where cleave direction control is lost, are defined as $\Delta K_{II^-}$ and $\Delta K_{II^+}$. These parameters are important to the design of the cleaving process, since low capture ranges would mean that the cleave plane can easily branch and cause cleave failure.

Determining the $\Delta K_{II^-}$ and $\Delta K_{II^+}$ factors as a function of dose and implant/anneal conditions are also relevant to the design of the cleaving system. An estimated $\Delta K_{II^-}$ to keep the propagation with a mixity ($K_{II}/K_I$) of −0.779 (the mixed-mode stress intensity ratio of a film bending mode M1 with no film stress P1) for {111} silicon with $\alpha_H^2 \approx 1$, is about −0.18 MPa-m$^{1/2}$.

Cleave failure is essentially defined as the unwanted branching of the cleave plane, usually resulting in fractured films. Avoidance of unwanted branching of the cleave plane is thus a consideration in the design of cleaving techniques. Other factors found to affect unwanted branching include but are not limited to crystal orientation, implant dose and depth, and temperature profile.

A series of closed-form equations have been developed to investigate cleaving behavior. Development of these equations assumes that a starter crack resulting from cleave initiation is present at a depth of (h) into the substrate. The crack depth is intended to define the thickness of the cleaved film. In many of the examples, h=50 μm, but any film thickness is allowed in the equations. The models assume a 5 mm detached film length (named c or sometimes L). The geometry is two-dimensional, meaning that the width w does not change as the cleaving occurs along a line.

The crack opening force mode ($K_I$), and the in-plane shear force mode ($K_{II}$), are important parameters for modeling the cleaving process. It would be expected that the resultant conditions leading to crack extension and propagation would match silicon or any other material if the known fracture energy for that cleaving configuration is utilized. For example, the fracture condition is known to occur in single crystal silicon when G' exceeds 2*γ', about 2.4 J/m$^2$ for an unimplanted layer.

The threshold for fracture propagation is defined as follows:

$$G = \frac{1}{E'_1}(K_I^2 + K_{II}^2) \tag{5}$$

where E'=the plane strain equation defined as E'=E/(1−υ$^2$), and, for all purposes of this document, G is G' and generally related to the cleave plane by equation (4):

$$G' = 2^*\gamma' = 2^*\alpha_H^2{}^*\gamma \tag{4}$$

FIG. 13 shows the general case of the propagation problem. Substituting equation (4) into equation (5) yields the following solution for KI and KII:

$$G' = \frac{1}{2E'}\left[\frac{P_1^2}{h} + 12\frac{M_1^2}{h^3} + \frac{P_2^2}{H} + 12\frac{M_2^2}{H^3} - \frac{P_3^2}{h+H} - 12\frac{M_3^2}{(h+H)^3}\right] \tag{6}$$

Where $P_n$ and $M_n$ are the forces and moments respectively, acting on each of the members.

The $K_I$ and $K_{II}$ factors then take the form:

$$K_I = \frac{P}{\sqrt{2hU}}\cos\omega + \frac{M}{\sqrt{2h^3V}}\sin(\omega + \gamma), \tag{7, 8}$$

$$K_{II} = \frac{P}{\sqrt{2hU}}\sin\omega - \frac{M}{\sqrt{2h^3V}}\cos(\omega + \gamma)., \text{ where:}$$

the parameters are derived from the forces, moments and geometry as described in detail by Hutchinson and Suo, "Mixed Mode Cracking in Layered Materials", Advances in Applied Mechanics, Vol. 29 (1992), which is incorporated by reference in its entirety herein for all purposes.

If the thickness of the remaining substrate (H) is assumed to be very large compared to the film thickness (h), the above equations (7, 8) can be simplified and collapsed into equations (9, 10) by the following:

γ (angle)=0
P=P1
M=M1
U=1
V=1/12
ω=52.07 degrees
η=h/H~0
All C constants are zero.

$$K_I = \frac{1}{\sqrt{2}}\left[Ph^{-1/2}\cos\omega + 2\sqrt{3}\,Mh^{-3/2}\sin\omega\right], \quad (9, 10)$$

$$K_{II} = \frac{1}{\sqrt{2}}\left[Ph^{-1/2}\sin\omega - 2\sqrt{3}\,Mh^{-3/2}\cos\omega\right],$$

Equations (9, 10) are used to derive the various configurations of the cleaving approaches. The equation is changed based on the configuration to include the appropriate force (P) and moment (M) relationships for the particular loading conditions.

Cleave Configurations Leading to $K_{II}$ Cancellation

The general equations 9 and 10 show that forces and moments imparted to the film will generate $K_I$ and $K_{II}$ stress intensity factors at the crack tip as described in the equations. The film force P is the force per unit width imparted to the film and related to film stress at the crack tip area as P=σ*h. The moment is the moment impressed onto the film that generates M at the crack tip.

The central effect used to cancel $K_{II}$ is to recognize that the M and P relation is additive in equation 9, but subtractive in equation 10. This means that application of a positive P and a positive M can add in $K_I$ while subtracting in $K_{II}$. Therefore, if the moment M and film stress force P are chosen correctly, the condition of simultaneously achieving crack extension while $K_{II}$ is cancelled (~0) would assure that the propagating crack has the greatest tendency to propagate along the cleave plane.

This optimized set of conditions would allow low or zero dose cleave plane operation, and even allow controlled depth guiding through active control of M and P as a function of the actual cleave depth achieved during crack extension. Such reduced or no dose conditions, and control over the depth of cleaving are among the significant benefits achieved according to certain embodiments of the present invention.

Coordinate System Used in the Models

To quantify the various configurations, a coordinate system was defined with the cleave plane along the X direction (positive X to the right), the thickness of the film along the Y-direction (positive in the up direction), and the Z direction is positive out of the surface. This coordinate system is used in the Finite Element Analysis (FEA) code. Software available from Ansys, Inc. of Canonsburg, Pa. (hereafter the AnSys software) was used to model the crack propagation system and included thermal and mechanical parts that interacted with a cohesive zone model (CZM) of the interface. The CZM code allowed the determination of conditions under which the applied stresses and moments would propagate the fracture.

The configuration of FIG. 13, where the detached, initiated film is to the left, was entered into the AnSys software. The results are summarized in the following sections and show the $K_{II}$ cancellation action resulting from different loading (P and M) configurations.

H-Layer Cleave Layer

The presence of an implanted layer serving to drive and guide a propagating cleave front is another element of a successful cleave configuration. The use of a low-dose cleave layer in addition to external energy (mechanical, thermal, etc.) can be simulated to yield a stable, desired cleave condition. A compressive cleave layer may impart a negative force (−P) and positive moment (+M) to the equations to accomplish energy controlled propagation cleaving or, with appropriate external M,P inputs are applied, $K_{II}$ controlled propagation can also be generated.

Cleave Configurations Leading to Controlled Propagation

A hydrogen cleave plane can act as an energy barrier to keep the propagation within the desired depth. If a changing propagating dose is used, the cleave depth will tend to change to maintain the cleave threshold energy condition. With a lower propagating dose for example, the cleave depth will tend to increase so as to harvest more of the implanted stress layer. This can only work to the point where the cleave plane is h+$h_c$, and if the integrated stress over the film P should fall below the threshold energy cleave condition, cleaving can no longer occur. An external M and P can inject enough energy to continue propagation and would tend to lower the cleave depth. If the implant dose is too small, its depth control function can be lost and uncontrolled cracking may occur. It is therefore a potentially important consideration that a sufficiently high dose of hydrogen be provided to act as a depth control layer, if reliable energy controlled propagation cleaving is used.

External Energy Configurations

Once an initiation region has been prepared as shown in FIG. 13, the general configurations leading to the application of M and P that can propagate the cleave front through the desired thickness is a complex mixture of chemical, physical, thermal and mechanical elements. These can be summarized as follows.

Mechanical Forces and Moments

Mechanically induced forces and/or moments on the film can add to the cleave energy and assist or allow controlled propagation. Due to the limited thickness of the film and its relative fragility, mechanical energy inputs are preferably positive moments to bend, and/or external plate coupled forces to push/pull the film in a controlled manner.

Moment Application Conditions

The moment applied to the film is a bending of the film away from the rest of the substrate. Such bending will generate $K_I$ and $K_{II}$ conditions that tend to move a crack towards the film or away from the substrate.

If a pure moment (P=0) is used, the $K_I$ and $K_{II}$ will change depending on the moment value, but will have a constant ratio ($K_{II}/K_I$) of −cos(ω)/sin(ω) or −0.78, since ω is unchanging with a value of 52.07 degrees. This ratio is defined as the mixity of the stress intensity, and its value determines the tendency for the propagating front to change in thickness (the Y-direction). The moment application is therefore negative in mixity (snapping the film), and proportional to the bending of the film as experienced by the crack tip.

There are stable, metastable, and unstable methods of applying moments to a film. Major configurations are summarized below.

Constant Moment Loading

A constant moment loading on a film can be developed using certain configurations as described here. One advantage of this configuration is the ability of the system to stay to a desired moment loading without active assistance. If a crack extension occurs with an application of a second load, for example, the system will continue being loaded with the same moment. This configuration is to be avoided if the moment is chosen to exceed the fracture strength of the material, since uncontrolled crack extension can occur.

The film bending moment can be applied either statically or quasi-statically or in a dynamic manner such as exciting the film ultrasonically in resonance or out of resonance. The moment loading M imparted to the crack tip according to certain embodiments of this invention, may increase the $K_I$ and $K_{II}$ stress intensity factors using ultrasonic motion, displacements, and forces to a design point to allow controlled crack propagation along a desired cleave plane.

If the guiding of the cleave plane is sufficient (high $\Delta_{KII-}$ and $\Delta_{KII+}$), then there would be no reason to add P to the configuration and a threshold crack extension along the desired cleave plane is possible. This would occur if the $\Delta_{KII-}$ and $\Delta_{KII+}$ are sufficiently high to counter the inherent $K_{II}/K_I$ mixity of −0.78 of this moment loading configuration. This does not occur naturally in silicon but with an optimized cleave plane, this may be a sufficient loading configuration to accomplish film detachment.

Constant Moment Loading Example Using Pressure and a Constraint Plate

In some embodiments, a plate positioned over the substrate having a limited compliance or at a predetermined spacing, may be utilized to constrain movement of the film separated during the cleaving process. Specifically, the presence of the constraint plate may reduce the in-plane shear mode component ($K_{II}$) during cleaving when a second loading is used.

According to certain embodiments, a releasable constraint plate comprised of an "S-layer" on a "P-plate" (together called a releasable constraint plate or a constraint plate) may be employed in combination with a source of pressure applied from the side, to accomplish cleaving of a film from a substrate. FIG. 14A shows a simplified schematic view of such an embodiment.

Specifically, the constraint plate 1402 comprising a P-plate 1404 and an S-layer 1406 is disposed over a top surface 1408 of a substrate or tile 1410 that is rigidly supported on a platen 1412. A back surface of 1414 of the constraint plate is rigidly supported in the vertical (Y) direction, but in a frictionless manner in the X-Z directions to accommodate compression.

The constraint plate 1402 contacts the underlying substrate, which may be optionally pre-loaded or compressed by a displacement in the Y (up) direction. Application of pressure 1416 (for example from a static or dynamically applied gas source 1418) to the side of the substrate 1410, results in film 1420 being pushed away from the remaining substrate and imparting a constant moment load.

During this process, movement of film 1420 occurs by the presence of the constraint plate 1402 with its compliant characteristic. The characteristic "S" shape is thereby imparted onto the film in a manner that is a well controlled function of the constraint plate material and dimensional characteristics and pressure 1416.

Figure 14B:
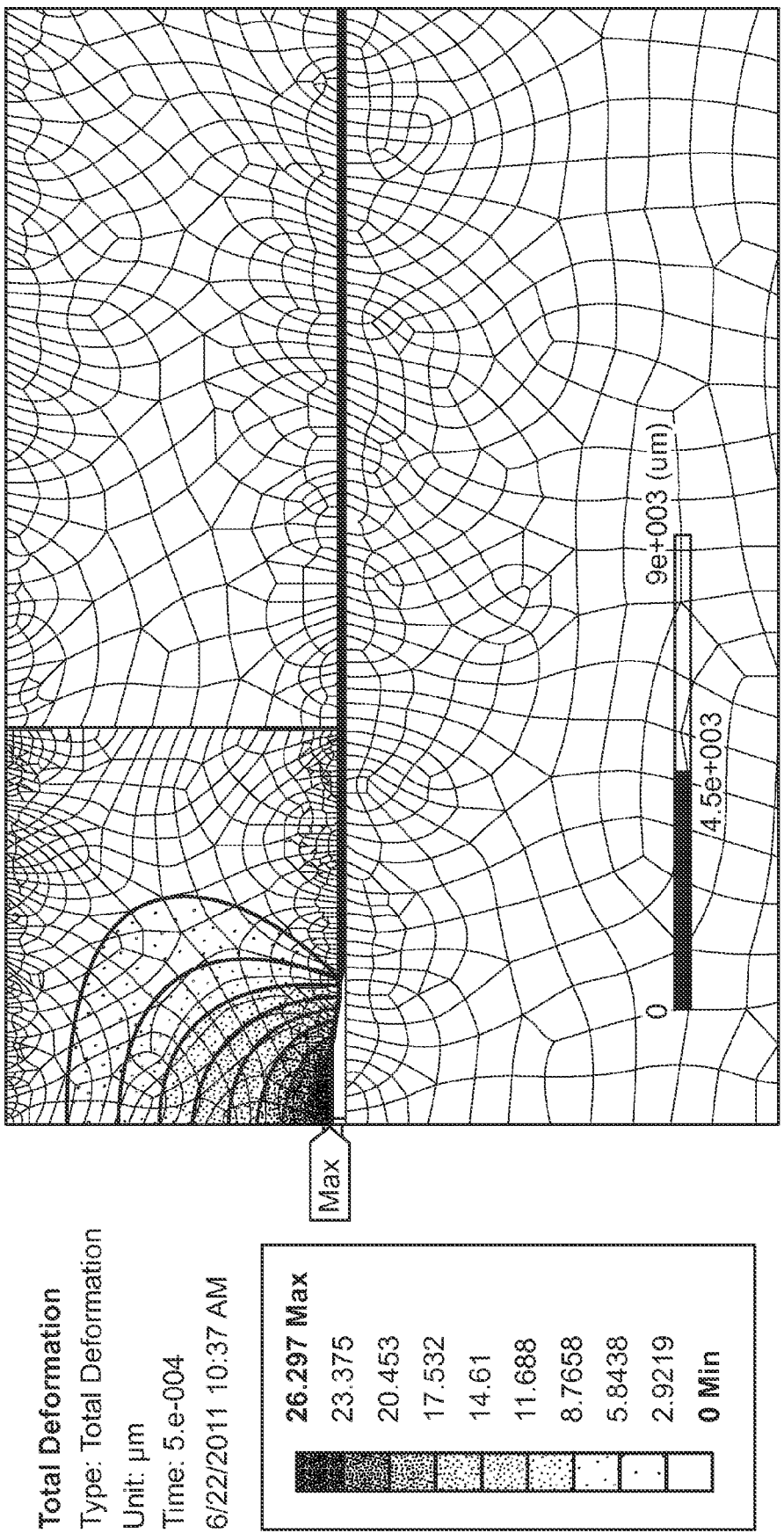
FIGS. 14B-14C show simulated stress for two different S-layers.
Figure 14C:
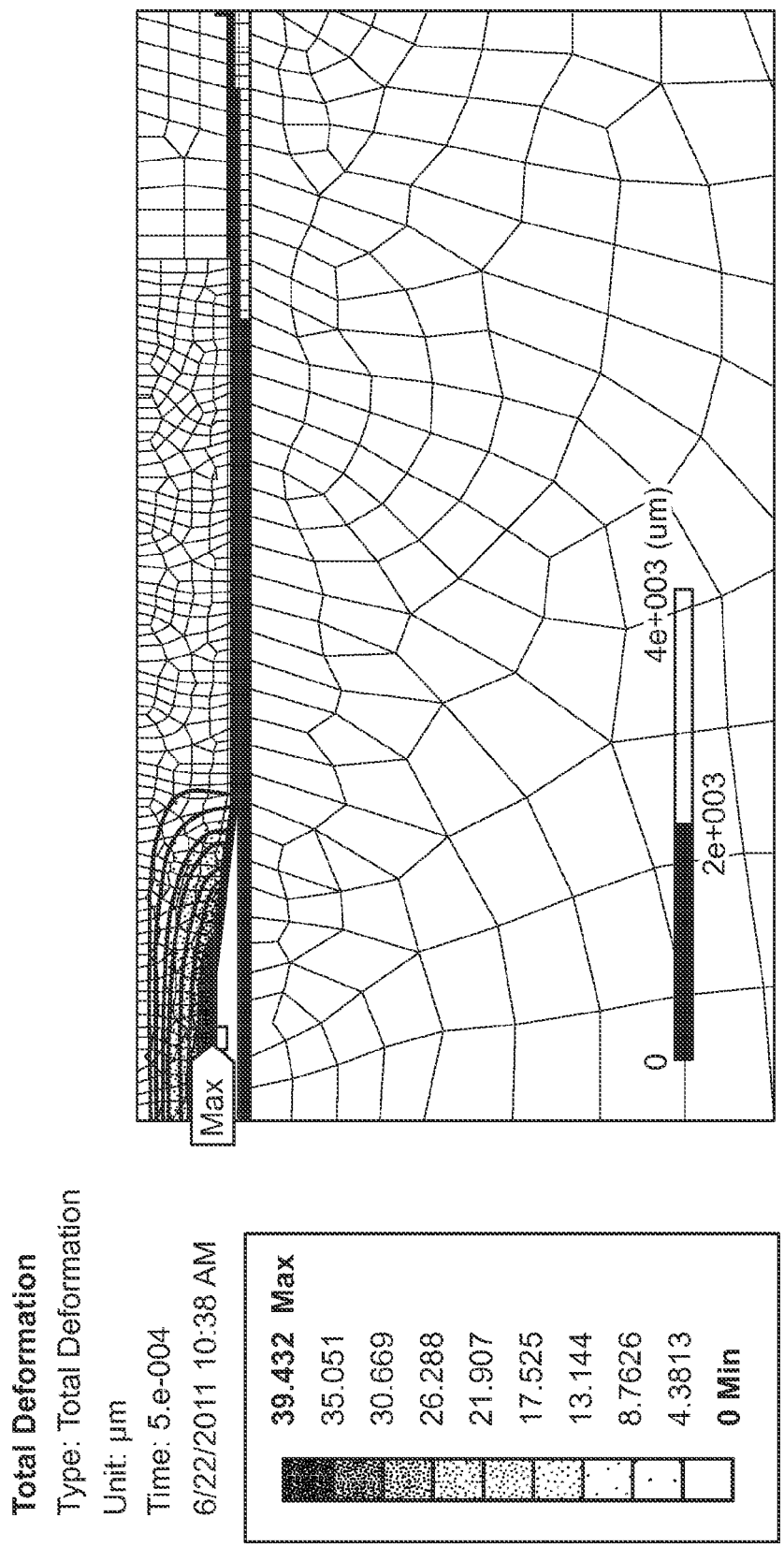

FIGS. 14B-14C show simulation results of the stress of the film resulting from cleaving utilizing such a constraint plate according to certain embodiments. In particular, the picture in FIG. 14B shows an S-layer comprising a porous high density polyethylene (HDPE) plastic material of thickness 6.3 mm and having a Young's modulus of 150 MPa, with an applied pressure in the chamber of 1 MPa (about 150 psi). In this simulation, the energy at the cleave front is $G_I$=13.4, and $G_{II}$=2.5. The movement of the cleaved film is shown exaggerated in the figure.

The simulation shown in FIG. 14B may be compared with that of FIG. 14C. In particular, FIG. 14C shows an S-layer comprising VITON™ material of thickness 800 um and having a Young's modulus of 20 MPa, again with an applied pressure in the chamber of 1 MPa (about 150 psi). In this simulation, the energy at the cleave front is $G_I$=15, and $G_{II}$=2.8. The near identical $G_I$ and $G_{II}$ energies of these two simulation results are expected, since they have similar Young's Modulus to S-layer thickness ratios.

An advantage offered by the configuration of FIG. 14A is its simplicity and the relative ease of generating the stresses necessary to propagate an initiated fracture in a pure or dominant moment mode. The use of the constraint plate confers the benefit that no blade is needed to perform the cleaving.

Derivation of the Moment Generated by a Pressure and a Constraint Plate

The moment generated by a constant moment configuration using a constraint plate can be derived. This moment shows a simple relationship between plate mechanical properties and the pressure applied to the crack area.

If the relevant parameters are defined as follows:
E=Silicon Young's Modulus;
Ep=P-Plate Young's Modulus;
Es=S-layer Young's Modulus;
Tp=P-plate thickness;
Ts=S-layer thickness;
h=film thickness;
σa=Pressure differential applied to film crack;
σn=Net pressure differential to film crack;
ΔLpl=Pre-load vertical displacement;
ΔLn=Net pressure induced film vertical displacement; and
c=S shape horizontal length;
then the main parameters are:

$$\sigma n = \sigma a - \Delta Lpl/(Ts*(1/Es+Tp/(Ts*Ep)))$$

$$\Delta Ln = Gn*Ts*(1/Es+Tp/(Ts*Ep))$$

$$G = \text{energy release in crack} = \sigma*\Delta L$$

$$M = [\sigma n*h^3*\Delta Ln*E/6]^{1/2}$$

$$c = [16*h^3*\Delta Ln*E/(3*\sigma n)]^{1/4}$$

Prior to the application of pressure, a mechanically applied vertical displacement or pre-load may be beneficially applied to aid in "locking" the uncleaved substrate to S-layer interface through pressure induced friction. Since the applied pressure must not leak into the substrate to constraint plate interface, a pre-load may also help seal the interface.

For relatively small strains, the action would be to reduce the net pressure applied by the pressure corresponding pre-load displacement. For 1-dimensional film propagation configurations, there is a 1/sqrt(2) reduction in the effective pressure driving the crack. As an example, if the constraint plate parameters are Tp=20 mm, Ep=2.25 GPa, Ts=375 um, and Es=20 MPa, and a 1 MPa pressure is applied to a 50 um film with no pre-load, the cleave parameters are:
M=0.147 N-m/m
G=5.19 J/m² with mixity of −37 degrees
c=1.36 mm
ΔLn=14.5 um The practical use of this method for further propagation from a small initiation area is apparent. The "S" crack length value c is about 1.4 mm and consistent with a laser initiated edge area that typically has a length exceeding 4-10 mm.

Force Application Methods and Cleave Propagation Conditions

If a force is applied to the side of the P-plate portion of the constraint plate and assuming that the S-layer has adequate grip (sufficiently high friction coefficient), a side force will be coupled to the film and to the substrate. As shown in connection with FIGS. 16A-C, if (i) the P-plate and the substrate are supported in the opposite side of force application, and (ii) the partially cleaved film is situated on the side towards the force application, a net P force (N/m) can be coupled to the crack front and inject $K_I$ and $K_{II}$ stress intensities according to equations (9)-(10) above.

The selection of the material characteristics must account for the strain necessary to develop the required force P on the silicon crack front. Using 2.4 J/m$^2$ as the necessary energy required to propagation in silicon along the (111) plane, the moment and forces M and P to achieve $K_{II}$=0 and the corresponding film strain for selected film thicknesses (infinite substrate thickness) are:

| Film Thickness (um) | Moment M (N-m/m) | Force P (N/m) | Film Strain (ppm) |
|---|---|---|---|
| 20 | 0.021 | 2.7 × 10$^3$ | 722 |
| 50 | 0.079 | 4.3 × 10$^3$ | 454 |
| 150 | 0.412 | 7.3 × 10$^3$ | 260 |

Since the P-plate is generating this strain, and a non-sliding contact is assumed between the P-plate and the cleaving film via the S-layer, it follows that the cleaving film too must be strained to that level. This relationship between target silicon strain and the required P-plate strain therefore serves as an estimate for the required side force loading for any given P-plate material and thickness.

Taking a 50 um film thickness cleave as an example, the film strain required is 454 ppm for achieving the $K_{II}$=0 cleave condition. Assuming a P-plate of thickness Tp and Young's Modulus Ep, the P-plate strain/force relationship can be derived as:

Force=Strain*$Ep$*$Tp$, where Force is in Newtons per unit depth (N/m)

For the 50 um example and Ep=2.25 GPa and Tp=20 mm, the $K_{II}$=0 condition will occur for a force of about 2e4 N/m. For a standard 156 mm square silicon solar cell form factor, the total force required is 3.1 kN or about 700 lbs force, readily achievable with pneumatics, motorized actuators and the like. At the end of the cleave, the total linear deformation would be about 454 ppm×156 mm or 71 um.

To discourage uncontrolled cleave conditions, a gradual S-layer compression profile could be used. For example, the S-layer displacement can be gradually increased from the cleave location and thus a gradually increasing pressure (and perhaps a P-plate force as well) would be required to achieve threshold cleaving. As a result, slowly increasing control of pressure (S-layer moment) and force (P-plate P force) would cause a corresponding slowly increasing cleave propagation.

Use of Releasable Constraint Plate

Figure 15:
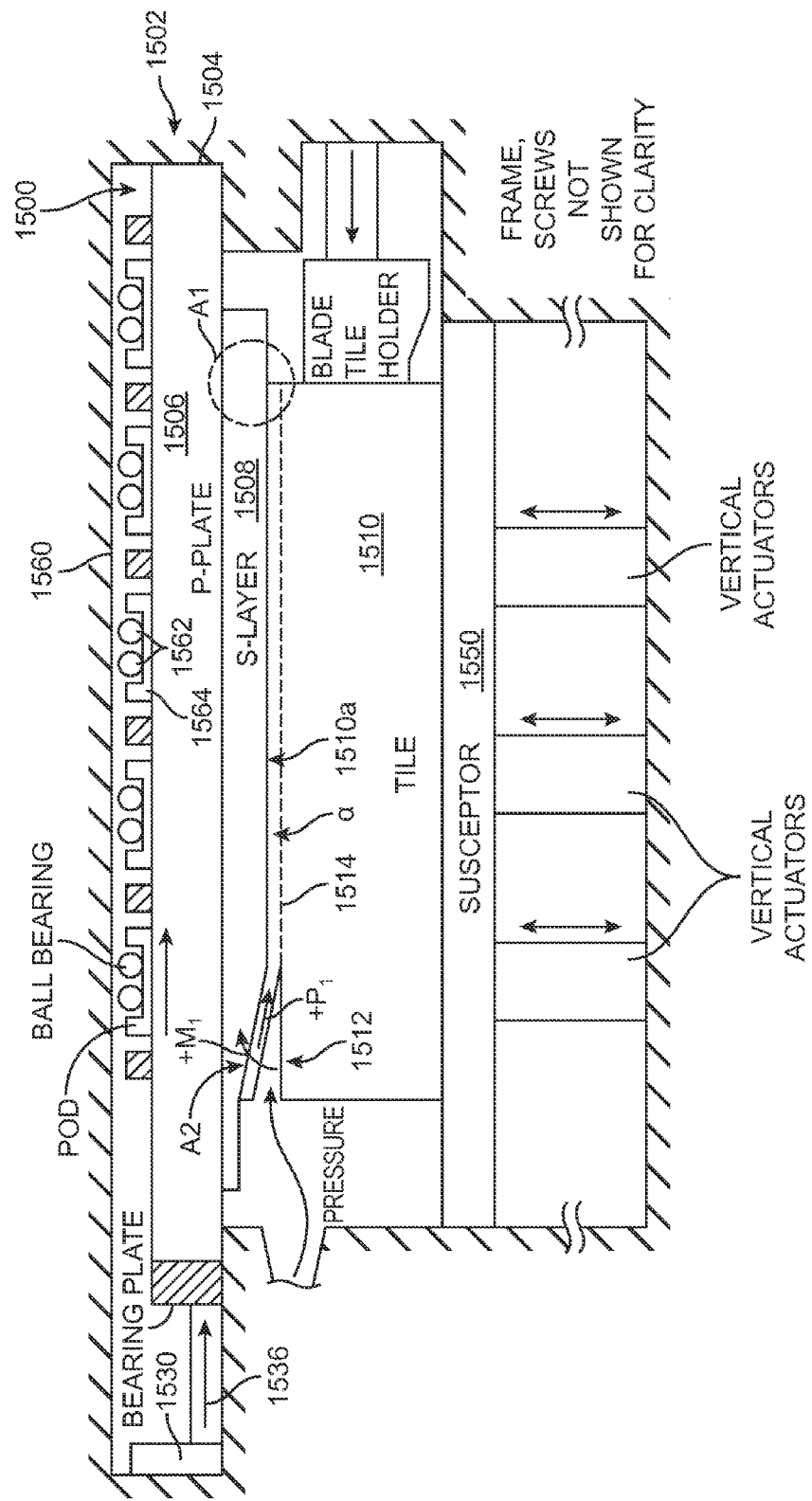
FIG. 15 shows a simplified cross-sectional view of an embodiment of a releasable constraint plate.

In certain embodiments, controlled cleaving according the present invention may be accomplished under conditions where the ratio of $K_{II}/K_I$ forces (also referred to herein as mixity), is intentionally balanced utilizing a releasable constraint plate structure. FIG. 15 shows a simplified cross-sectional view of one embodiment of such a releasable constraint plate in accordance with the present invention.

In particular, the embodiment of FIG. 15 shows a releasable constraint plate 1500 that is positioned within a telescoping high pressure chamber 1502 defined within walls 1504. The releasable constraint plate 1500 may comprise a plate that can couple side forces (the "P-plate" 1506) and a thin, softer compliant layer (the "S-layer" 1508) situated between the P-plate and the workpiece or substrate 1510.

A second side of the complaint S-layer material is in contact with the upper surface 1510a of workpiece or substrate 1510. Workpiece or substrate 1510 comprises a cleave initiation portion 1512 and a cleave region 1514 that is located at a depth d from the upper surface. This cleave region may be formed by the energetic implantation of ions, as has been previously described.

The workpiece is supported within the chamber by a susceptor 1550. This support should be sufficiently rigid to allow for the efficient coupling of vertical displacements and for S-layer pressure coupling. A pressure-tight seal is used across interfaces under the workpiece. For example a vacuum seal under the workpiece 1510 using an o-ring or lip seal (discussed in detail below in connection with FIGS. 18, and 18A-18I) in the peripheral region A1 would serve as a temporary gas-tight seal.

In operation, a high pressure environment is created within the chamber. By virtue of the resulting pressure developed deformation of the compliant S-layer, a predominant moment is created within the crack tip while the pressure also acts to secure the cleaved layer to the S-layer surface, and thus also against the surface of the releasable plate.

A moveable element 1530 is fixed to a wall of the chamber proximate to the location of the cleave initiation portion in the substrate. In one embodiment, the moveable element comprises a high force motorized actuator that develops a predictable and reproducible amount of physical deformation.

The moveable element is in physical communication with the side of the compressible P-plate through a rigid armature 1536. In FIG. 15 this armature is shown as having a rectangular profile, but in other embodiments it may exhibit other shapes or profiles.

To allow the P-plate to compress in the horizontal direction under the application of this side force while staying rigid in the vertical direction to support the S-layer pressure deformations, a frictionless 2-dimensional kinematic mounting configuration may be used. For example, the P-plate top surface could be connected to a rigid top surface 1560 (which may be a wall or a top plate) via ball bearings 1562 that are contained within pods 1564.

Upon application of a signal to actuate the moveable member, the moveable member exerts a linear force P in the direction shown by the arrow. This expansion force is in turn translated through the rigid armature that is in contact with a point on the side of the P-plate having a thickness Y.

In response to the linear force received at its side, the P-plate, mostly constrained in the vertical direction experiences compression along the horizontal direction. This is turn develops a force P loading, shown here as +$P_1$. Owing to the pressure bonding between the releasable constraint plate and the substrate, this force loading is in turn communicated to the thickness of material of the underlying substrate. This force serves to add to the S-layer pressure induced moment loading +$M_1$ to permit cleaving to occur along the cleave plane in a controlled manner, allowing the thickness of material to be detached from the substrate.

While the pressure differential is being maintained, the thin detached film of material remains secured to the releasable plate. The remaining substrate may be removed, and the opposite side of the detached film placed into contact with another member. In certain embodiments, this other member may comprise a transfer substrate or chuck used for temporary handling of the thin detached film. In some embodiments, this other member may comprise a portion of the end product in which the detached film is to be incorporated.

With the configuration shown in FIG. 15, a number of parameters affect the character of the moment and force loading imposed upon the substrate by the releasable constraint plate. Examples of such parameters include but are not limited to the thicknesses and Young's modulus of the S-layer and P-plate.

In the specific embodiment described in connection with FIG. 15, the source of the linear force is a moveable member comprising a motorized actuator. Examples of suitable actuators are servo actuators such as the EC3 and EC5 available from Kollmorgen of Radford, Va. Force and displacement feedback sensors coupled to the linear actuator as shown in FIG. 15 could help control and measure cleaving.

However, embodiments are not limited to embodiments utilizing linear force applied by motorized actuators, and other sources of linear force could be employed. One such alternative embodiment could utilize actuation of a hydraulic cylinder to impose the desired linear force upon the releasable plate. In another embodiment, the linear force could be applied by another type of actuation, for example a piezoelectric material.

While the above is a full description of certain specific embodiments, various modifications, other constructions and equivalents may be employed. For example, while the embodiment of FIG. 15 shows a releasable plate having an S-layer interface, a lip seal oriented to contact a periphery of the substrate could be used to help seal the workpiece to S-layer interface. Embodiments of such a lip seal are shown and described in connection with FIG. 18. A releasable plate according to some embodiments could include porous materials including across the entire surface of the plate in contact with the substrate.

Three Step Cleave Sequence

Figure 16A:
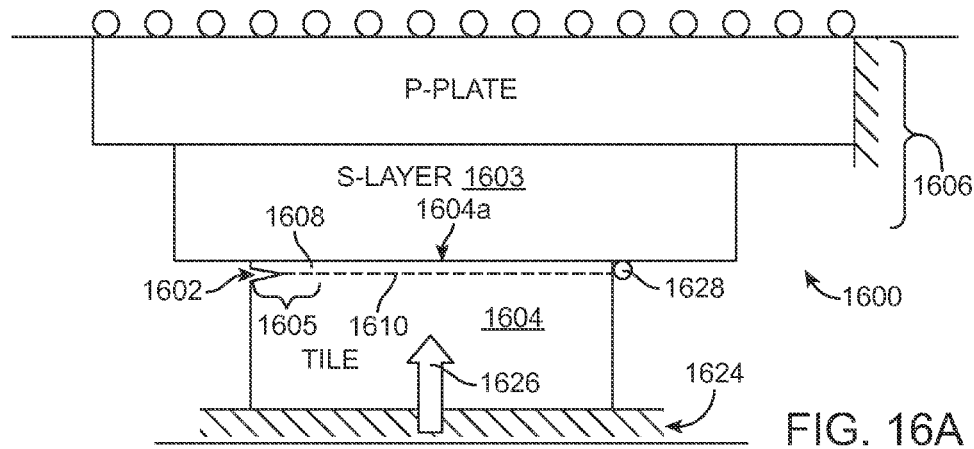
FIGS. 16A-16C are simplified cross-sectional views showing a cleaving process.
Figure 16B:
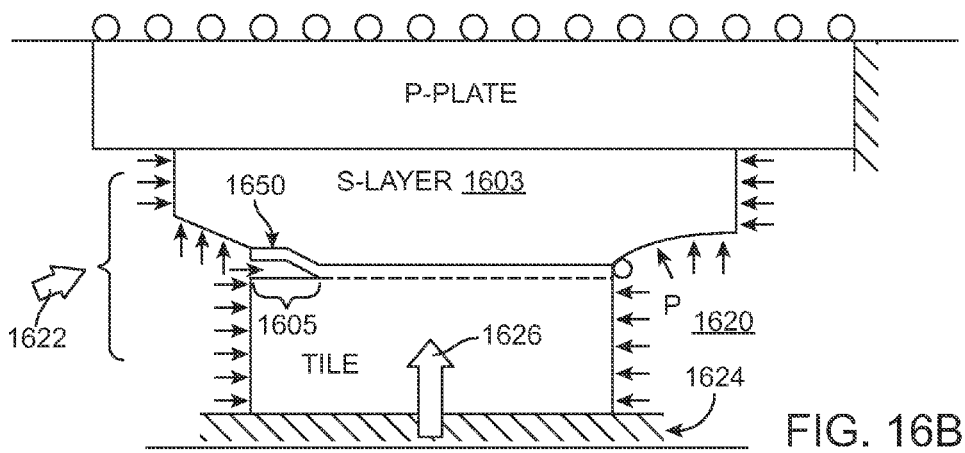
Figure 16C:
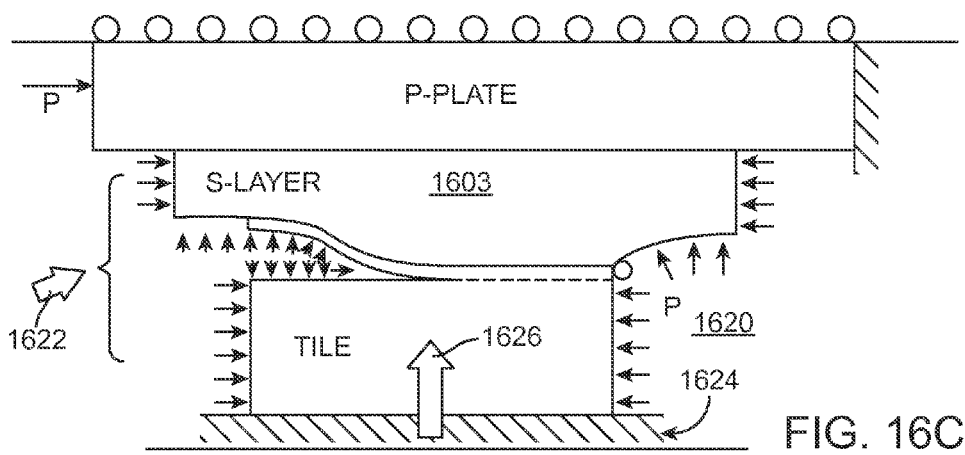

The process may be described using three steps as shown in FIGS. 16A-C. As the first step 1600, an initiated region 1602 is formed using an external energy source such as a laser within a higher dose region 1605 along an edge of the substrate 1604. Where the cleave configuration may use a pressure differential introduced within a pre-existing crack, the initiation region connects to a peripheral portion of the workpiece. Laser induced initiation regions typically measure 4-10 mm in diameter in roughly a semicircular shape within the workpiece.

After this process step, the workpiece or substrate 1604 is placed into contact with the releasable constraint plate 1606. A thickness of material 1608 to be detached from substrate 1604, is defined between surface 1604a and cleave initiation portion 1602 and cleave region 1610. Selected applications of S-layer pressures and P-plate side forces will complete the remaining steps as explained below.

The second and third cleave steps have the substrate and the releasable plate positioned within a pressure volume 1620 that is in selective communication with a source of high pressure 1622. The bottom of the substrate may be positioned on a chuck or other type of support 1624.

An exposed portion of the S-layer component 1603 of the releasable constraint plate is placed into contact with a displacement 1626 and a peripheral seal 1628 such as a lip seal whose operation is described below. As a result of this displacement, the releasable constraint plate is effectively clamped onto the surface of the substrate.

Next a pressure difference p is applied within the pressure vessel, that in turn acts to create a moment to extend the initiation region from a small edge defined area to a tab spanning a portion of the higher dose region 1605. The pre-load vertical displacement, dose profile and pressure are controlled to develop a first propagation that forms a "tab" 1650 of sufficient width to allow the lower dose third cleave step to occur. For example, a tab of 6-10 mm in width across an edge of the substrate could be sufficient to allow $K_{II}=0$ cleaving without releasable constraint plate slip.

Once the tab has been formed, as shown in FIG. 16C step three can occur where propagation through the lower dose region is made in a near $K_{II}=0$ condition using a combination of S-layer pressure and side force P. The side force P is now applied and couple to the now relatively well formed crack front to propagate the cleave front in a controlled manner through the lower dose region.

Using a motorized actuator, electric signals are applied to the actuator to push on the P-plate with a predetermined side force P. As a result of the application of this side force, the P-plate experiences a physical deformation which in turn imposes a mechanical force as a force P coupled to the S-layer.

The S-layer in turn transfers this mechanical force to the surface of the substrate. This force can be used to perform controlled cleaving of the thickness of detachable material from the substrate.

Following the controlled cleaving, force application by the motorized actuator can be halted. This allows the P-plate to return to its undeformed shape.

Figure 17:
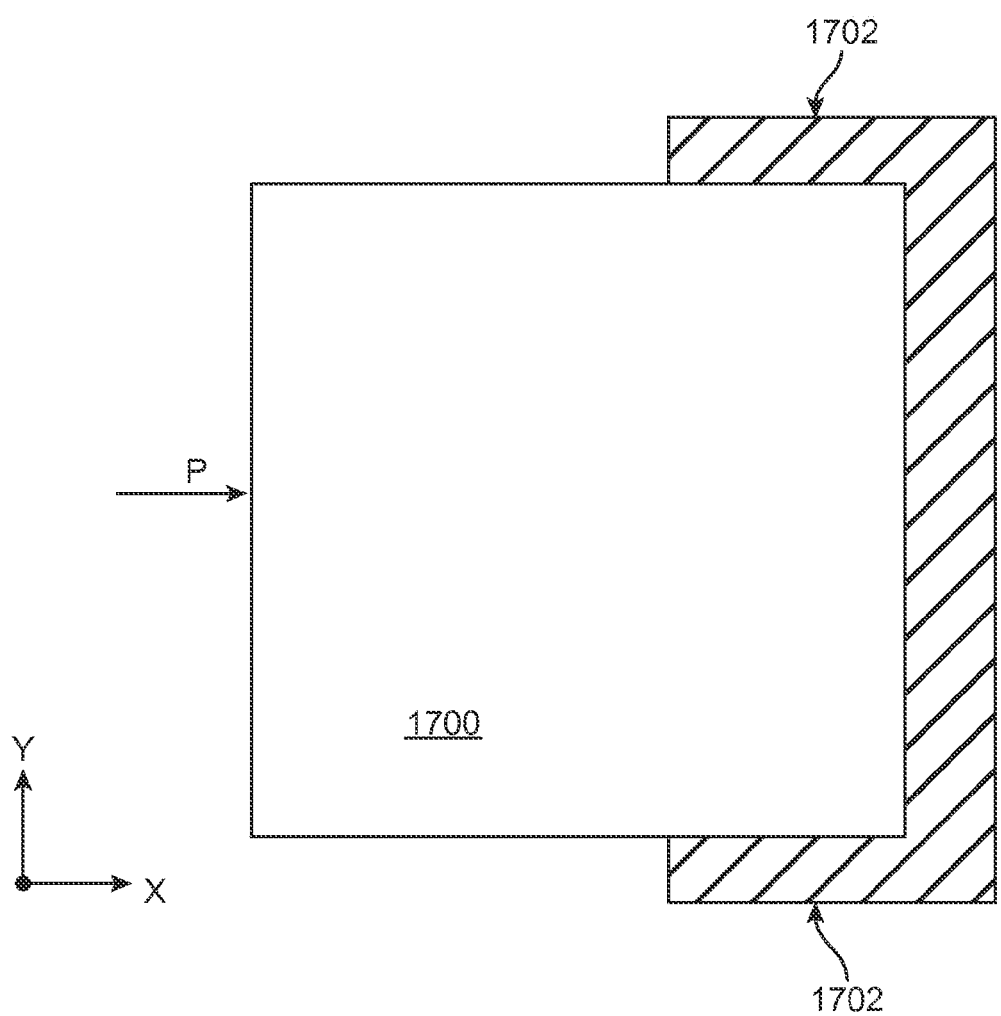
FIG. 17 shows a plan view of an embodiment of a constraint plate.

In certain embodiments it may be desirable to carefully control or limit the direction of the applied force. FIG. 17 thus shows one possible alternative embodiment wherein the releasable plate 1700 is selectively secured in place at certain of its edges, by anchors 1702. This configuration serves to restrict deformation of the plate in the direction of one axis (here the X-axis), while permitting deformation in the direction of another axis (the Y-axis). Such control over the manner of deformation of the releasable plate, can in turn allow control to be exercised over the direction of mechanical forces imposed during controlled cleaving.

While the above embodiments impose mechanical forces and moments to accomplish controlled cleaving, the present invention is not limited to this approach. Alternative approaches for imposing a mechanical force may be utilized.

Continued propagation of the film could be accomplished by reducing pre-load displacement or gradually increasing the forces and moments controls.

According to certain embodiments of the present invention, a thickness of material may be detached from a substrate by controlled cleaving along a cleave plane. In some embodiments, controlled cleaving with a desired mixity of $K_{II}$ and $K_I$ fracture modes, may be achieved utilizing a releasable constraint plate that is adhered to the substrate surface.

Certain embodiments may employ controlled cleaving utilizing a plate which maintains dominance of $K_I$ forces during cleaving. Alternative embodiments may employed controlled cleaving utilizing a plate with maintains dominance of $K_{II}$ forces during cleaving. Thicknesses of material detached by controlled cleaving according to embodiments of the present invention may be particularly suited for incorporation into solar cells.

Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In certain embodiments, the backing substrate can be applied to each of the substrates, including handle and donor. In alternative embodiments, coatings may also be provided on surfaces or other regions of the transparent material. Therefore, the above description and illustrations should not be taken as limiting the scope of the present invention which is defined by the appended claims.

Equipment Description

Propagation of a cleave front through a substrate, may be understood as occurring through one or more fracture modes, as are illustrated in FIG. 12. A first fracture mode comprises an opening or tensile mode ($K_I$), where cleaving forces act substantially perpendicular to a direction in which the cleave front is propagating. A second fracture mode comprises a shearing or sliding mode ($K_{II}$), where cleaving forces lie substantially parallel to the direction in which the cleave front is propagating. A third fracture mode comprises a tearing or out-of-plane mode ($K_{III}$), where cleaving forces are substantially out of a plane along which the cleaving is occurring.

Cleaving according to embodiments of the present invention may utilize a cleave plane. FIG. 11 shows a simplified view of an embodiment of a workpiece 1102 having a cleave plane 1106 formed therein.

The cleave plane affects the cleaving action through stress and layer weakening effects. In certain embodiments, the cleave plane may be formed by energetic implantation of ions (such as hydrogen) into the workpiece. Such implantation is discussed in U.S. Patent Publication Nos. 2008/0206962, and 2008/0128641, both of which are incorporated by reference in their entireties herein for all purposes.

One effect upon cleaving action of the end-of-range (EOR) hydrogen implant layer, is the reduction in fracture strength around the cleave plane. Such reduction in fracture strength can be caused by bond damage and by stress induced by the presence of the hydrogen itself. These considerations can lower the energy needed to create a new surface during cleaving.

The cleave plane can be used both as an initiating layer at higher doses, and as a guiding or propagating layer when the dose is lower. Cleave guiding at lower doses is mostly dominated by the implanted hydrogen compressive stress profile. FIG. 13 shows the mechanical configuration of cleave propagation following an initiation process.

Specifically, FIG. 13 shows a layer of thickness h partially released from the rest of the silicon ingot substrate having thickness H. Due to the much larger dimensions of the substrate relative to the cleaved material (h<<H), the tile moment and forces M2, P2, and M3, P3 are understood to be very small. The source of stress intensity seen at the crack tip is thus dominated by M1 and P1, the moment and force coupled to the partially released film.

The implanted hydrogen compressive stress profile helps keep the cleave front propagating along the cleave plane. Specifically, a cleave guiding effect is the shear force generated by the in-plane compressive layer that is generated when the cleave front moves away from the center of the compressive stress profile.

Deviation of the cleave front depth away from this center point of compressive stress, will tend to generate an in-plane ($K_{II}$) shear force having a polarity that tries to maintain the cleave front propagating parallel to and within the cleave plane over some range of shear stress intensity values (non-zero $K_{II}$). Thus, if the cleave front starts moving up to the surface, a positive ($K_{II}$) shear force will guide the cleave front lower towards the center. Conversely, if the cleave front starts moving lower into the tile, a negative $K_{II}$ shear force will guide the cleave front higher towards the center. This phenomenon occurs because any non-zero $K_{II}$ generated during cleaving will tend to guide the fracture plane away from the cleave plane so as to minimize $K_{II}$.

The phenomenon just described can be cancelled to some extent, by the shear generated by the cleave layer that is generated in the opposite direction. The result is a net offset in cleave depth that becomes the new cleave depth where $K_{II}=0$. This slight movement of the cleave depth has been experimentally observed, and the maximum shear that the cleave layer can absorb is related to the compressive stress level present at the cleave plane and the straggle (Rp) of the implant defining the cleave plane. Once the shear stress level is higher than this critical level, the cleave front will jump out of the cleave plane and cleave failure will occur.

It is therefore a potential design consideration to have a cleaving configuration that minimizes the induced $K_{II}$ shear forces, in order to allow controlled cleaving at the desired depth with low propagation doses. The effect can be modeled by a capture range of $K_{II}$ stress intensities within which the cleave propagation direction continues to lie parallel and close to the $K_{II} \approx 0$ fracture propagation plane.

Certain embodiments of the present invention relate to controlled cleaving along an implanted subsurface cleave plane within a semiconductor workpiece. Particular embodiments allow independent application of a linear cleaving shear force ($+P_1$) coordinated with an independent application of a cleaving moment ($+M_1$). The cleaving moment ($+M_1$) drives the cleaving through a combination of opening or tensile stress intensity ($K_I$) and shear stress intensity ($K_{II}$). The linear cleaving shear force ($+P_1$) counteracts a tendency of the cleave front to move out of the implanted cleave plane through moment alone.

The independent control over ($+P_1$) afforded by embodiments of the present invention, allows cleaving to take place in a controlled manner by minimizing the unwanted shearing or sliding fracture mode ($K_{II}$) that can roughen or damage the cleaved layer Embodiments of the invention allow the formation of thin, smooth cleaved layers particularly suited for photovoltaic applications.

Figure 18:
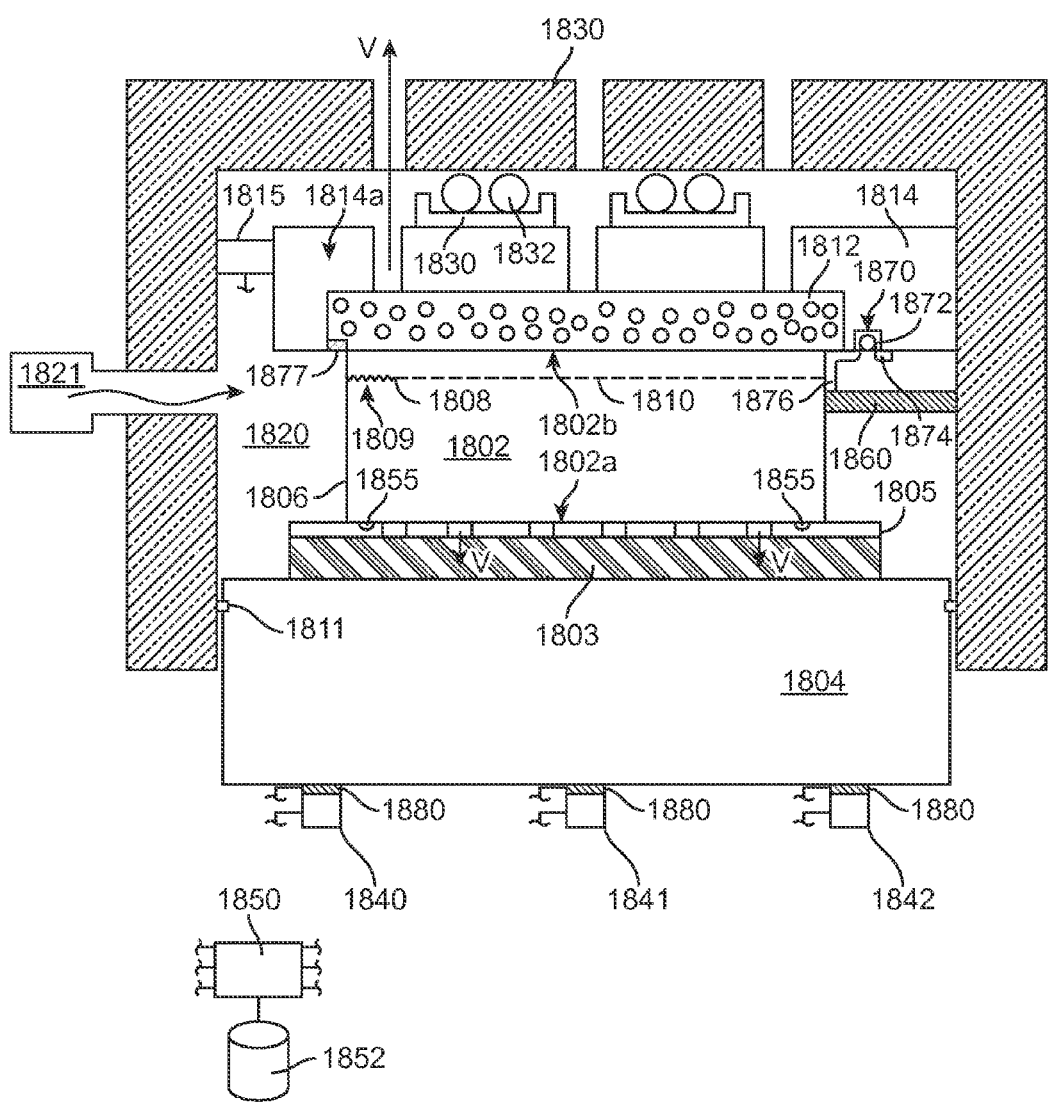
FIGS. 18 and 18A-18I show simplified cross-sectional views of an embodiment of a releasable constraint plate.

FIG. 18 shows a simplified cross-sectional view of a cleaving apparatus in accordance with one embodiment of the present invention. Specifically, a backside 1802A of workpiece 1802 is in contact with an adapter piece 1805 that includes channels allowing suction from a vacuum chuck 1803 to secure the workpiece against a seal 1855. The adapter piece 1805 is also responsible for ensuring the proper placement of the workpiece relative to other elements of the apparatus, for example the S-layer as described further below.

The vacuum chuck is moveably connected to elevator 1804 whose movement in the vertical direction can allow loading and unloading of the workpiece therefrom. The elevator is in contact with actuators 1840-1842 that can also impart a limited tilt to the workpiece 1802. Load cells 1880 can determine the relative forces on the actuators 1840-1842.

As shown FIG. 18 the seal may be in the form of an o-ring or other pliant member in contact with the workpiece backside, with the o-ring sealed by the suction force of the vacuum. In certain embodiments, the seal 1855 may comprise a lip-seal in contact with the sides of the workpiece, as is further described in detail below.

In embodiments relying upon contact between the sealing member and the backside of the workpiece, it may be desirable to have the o-ring or other pliant member positioned close to the perimeter of the workpiece as is feasible. This maximizes the area of the workpiece exposed to the vacuum to ensure that no separation occurs between the workpiece 1802 and chuck 1803 as chamber pressures vary from ambient (e.g. during loading/unloading) to high (e.g. during application of the cleaving pressure). Assuming the top of the workpiece is evacuated to atmosphere, this lifting effect can occur when the bottom area exposed to p subjects the workpiece to an upward force that exceeds the downward force developed by the area under vacuum.

A first end 1806 of workpiece 1802 includes a subsurface high dose implanted cleave initiation region 1808. A subsurface lower dose implanted cleave propagation region 1810 extends outside of the cleave initiation region.

Workpiece 1802 further includes a cleaved portion 1809 within the cleave initiation region 1808. FIG. 18 is not drawn to scale for purposes of illustration, and thus the dimensions of the cleaved portion are grossly exaggerated in this figure.

In some embodiments, the cleaved portion 1808 may be formed by the localized application of concentrated thermal energy to the cleave initiation region. According to certain embodiments, the cleaved portion may be formed by a laser, for example as is described in the pending U.S. patent application Ser. No. 13/195,259 that is incorporated by reference in its entirety herein for all purposes.

Elevator 1804 is moveable in the vertical direction (Z-axis) to position the workpiece within the surrounding sealing member 1811. In this orientation, the frontside 1802B of workpiece 1802 is in contact with porous compliant S-layer 1812 that is supported upon lower surface 1814a of P-plate 1814. This S-layer is porous and hence able to evacuate the workpiece to a secondary pressure, usually atmospheric pressure. As discussed below, the S-layer is also compliant to accommodate forces during the cleaving process. An example of the material forming the S-layer is DELRIN Acetal Resin (Polyoxymethylene) thermoplastic available from DuPont, Wilmington, Del., USA.

Plate 1814 includes a projecting region 1814a corresponding to the first end of the workpiece. The opposite end of the plate is fixed in the horizontal direction (X-axis).

Actuator 1815 may extend in the horizontal direction to physically contact the projecting portion. As is further discussed in detail below, such horizontal actuation of the actuator against the projecting portion results in the production of a linear cleaving shear force ($+P_1$) being exerted upon the cleaved portion. The workpiece is secured in place from the opposite direction by member 1860.

Figure 18A:
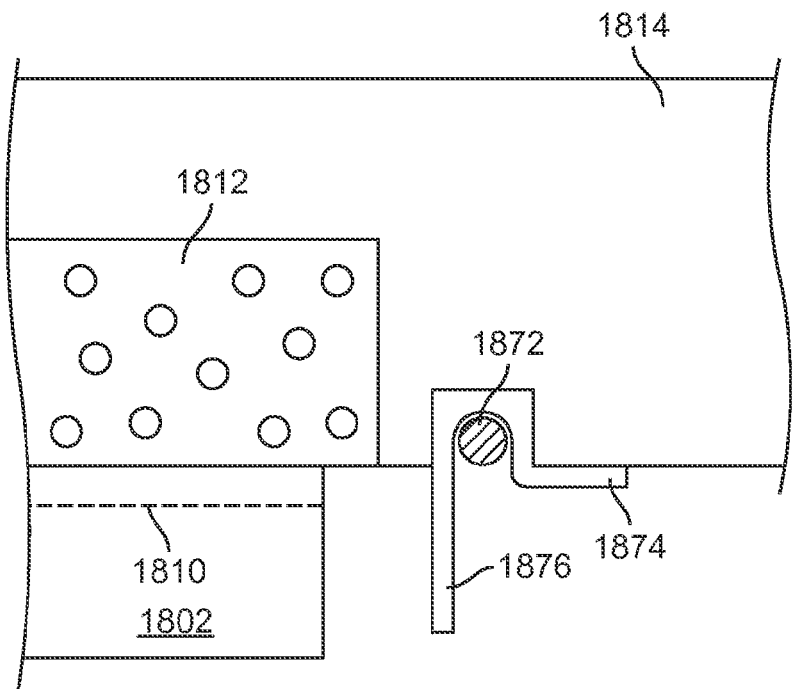
Figure 18B:
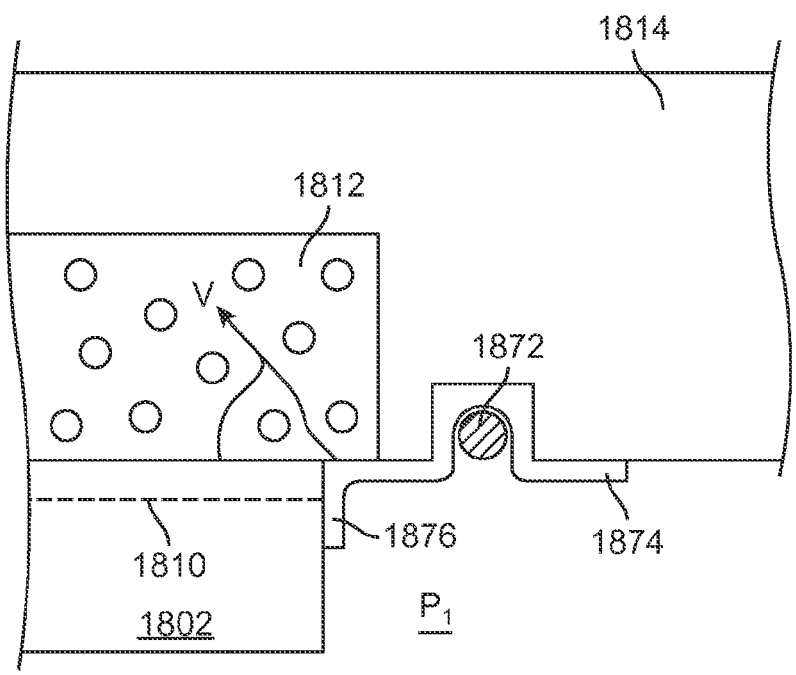

FIGS. 18A-18B show the operation of the lip seal. Specifically, FIG. 18A shows the contacting of workpiece 1802 comprising cleave propagation region 1810, with the porous S-layer 1812 prior to sealing. Positioned in the P-plate 1814 is a lip seal structure 1870 comprising a sealing member 1874 that includes a flexible portion 1876. The sealing member 1874 can comprise different flexible materials, and in certain embodiments can comprise for example HT-6210 liquid silicone rubber sheeting from Rogers Corporation, Carol Stream, Ill., USA.

The sealing member 1874 may be secured to the P-plate by the pressing of an o-ring 1872 into a recess therein, resulting in the flexible portion 1876 projecting upward away from the surface of the K-plate. As shown in FIG. 18A, this configuration is desirable in that prior to the sealing step, it allows vertical movement of the workpiece past the flexible member to contact the porous member. In certain embodiments, the pressing of the o-ring into the recess and the corresponding raising of the lip seal can occur by virtue of upward movement of the elevator forcing the o-ring into the recess. An alternative embodiment in the form of a frame surrounding the workpiece and incorporating the lip seal material could also be used.

FIG. 18B shows the sealing step. In response to the pressure differential arising between the pressure p in the chamber and the pull of a force V caused by an evacuating pressure differential through the porous S-layer, the flexible portion 1876 of the sealing member 1874 is pulled against the side of the workpiece to create the seal. Initially, this pressure differential would be attributable solely to a lower pressure V such as a vacuum. Since flexible elastomers are of a self-energizing type, the application of a positive pressure within the chamber to accomplish cleaving enhances the sealing effect of the lip seal. In certain embodiments, the sealing could be further assisted by actively disposing the flexible portion against the side of the workpiece, for example utilizing a positive pressure or other approach.

The lip seal is present around nearly the entire perimeter of the P-plate. However, as shown in FIG. 18, in certain embodiments the lip seal does not extend to a local area proximate to the cleave initiation region. This is to allow the positive pressure within the chamber to gain access to the cleave initiation region and thereby contribute to the controlled cleaving. To prevent unwanted leakage in this limited area, portions of the surface of the S-layer corresponding to regions lacking the lip seal, may bear a non-porous coating 1877.

In certain embodiments, a seal may extend around the entire perimeter of the P-plate. Injection of the initiation pressure can be made within the gastight region defined by a lip seal conforming against a side of the workpiece, through a port or channel machined within the P-plate. According to some embodiments, gas pressure injection in a dynamic manner is possible. Such dynamic pulsed pressure involves the application of a pressure that changes over time, for example in certain embodiments a pulse of increased pressure from a second gas source that is applied locally to the initiation region through a channel in the P-plate. Dynamic application of pressure during cleaving according to certain embodiments may offer the benefit of allowing better threshold cleave control.

Engagement of the lip seal creates a peripheral gastight region 1820 around the cleaved portion. A pressurized gas from a source 1821 is introduced through a port in the high pressure vessel. As is also further discussed in detail below, pressurization of the gastight region in this manner or through a separate port as described above results in a moment cleaving force ($+M_1$) being exerted upon the cleaved portion.

P-Plate 1814 is secured from movement in the vertical direction, by contact with stiff support 1830. Intervening ball bearings 1832 retained within trays 1834 on the top surface of the plate, permit a small amount of lateral movement of the plate relative to the stiff support. This small amount of permitted lateral motion serves to accommodate the compression of the plate by action of the actuator that results in application of the linear cleaving force ($+P_1$).

The stiff support is in turn secured an overall support structure that has enough overall stiffness to allow only limited flexure under loading.

The elevator is fixed to three linear actuators 1840-1842. These actuators are independently actuable. Their points of contact with the elevator allow the three-dimensional position of the elevator to be altered. Where the elevator is fixed in position by virtue of the loading of the workpiece, selective actuation of the linear actuators allows the application of force in the vertical direction, per the pre-loading and loading discussions below.

While the particular embodiment of FIG. 18 shows the three linear actuators as being in contact with the elevator, this is not required. Alternative embodiments could employ linear actuators in contact with the stiff support so as to apply forces to the workpiece.

As shown in the FIG. 18, the various components of the system are in electronic communication with a central processor 1850 that is in communication with computer-readable storage unit 1852. The processor is configured to coordinate operation of the system elements based upon instructions from code stored within the unit 1852. The various operational modes of the processor and stored codes instructing same, are discussed further below.

Cleaving according to certain embodiments may rely upon a fixed grip between the compliant plate and the workpiece, as reflected for example by an unchanging vertical distance between the bottom of the workpiece and the top of the P-plate. Accordingly, the chamber may include a vertical distance gauge to measure this distance. An example of such a vertical distance gauge, which may be suitable for use in accordance with the present invention, is available from HEIDENHAIN CORPORATION, of Schaumburg, Ill. Such gauges can be used to control the actuators 1840-1842 through a servo loop to maintain a fixed grip configuration through the large force changes that occur during cleaving.

Various operational phases of the apparatus of FIG. 18 are now described in connection with FIGS. 18C-H. These FIGS. 18C-H show the disposition of forces in three-dimensions on the P-plate/S-layer and workpiece, with other elements of the apparatus omitted for clarity.

Figure 18C:
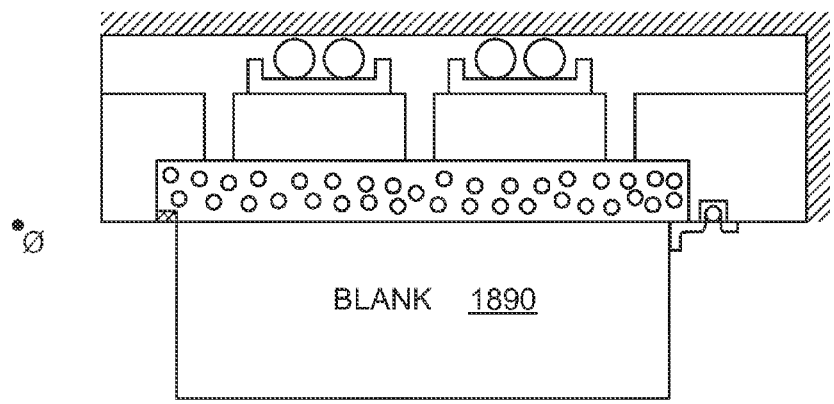

A computer pre-processing (calibration) phase is shown in FIG. 18C. In this computer pre-processing phase, a workpiece blank 1890 is disposed in contact with the plate, and the apparatus is calibrated. Examples of such calibration include the initial position of the elements in three-dimensional space, the setting of the vertical distance gauge, and the force readings of each of the actuators. In this neutral force state, the P-plate and the S-layer are experience little or no compression.

Figure 18D:
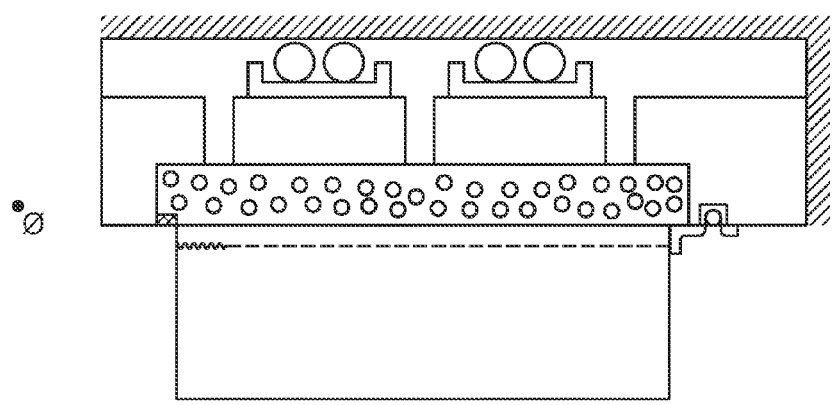

A workpiece insertion phase is shown in FIG. 18D. In this phase, the elevator is raised such that the workpiece including the cleave plane and the cleaved portion, comes into contact with the S-layer in the plate. The elevator is raised until the readings of the load cells reflect the exertion of predetermined forces in the Z-direction. The vertical position of the elevator is then locked in place.

Next in this insertion phase, the voltages applied to the actuators are finely adjusted to re-establish the original calibrated neutral force state. The setting of the vertical distance gauge is set to zero. The lip seals are engaged to create the gastight seal around the cleaved portion.

Figure 18E:
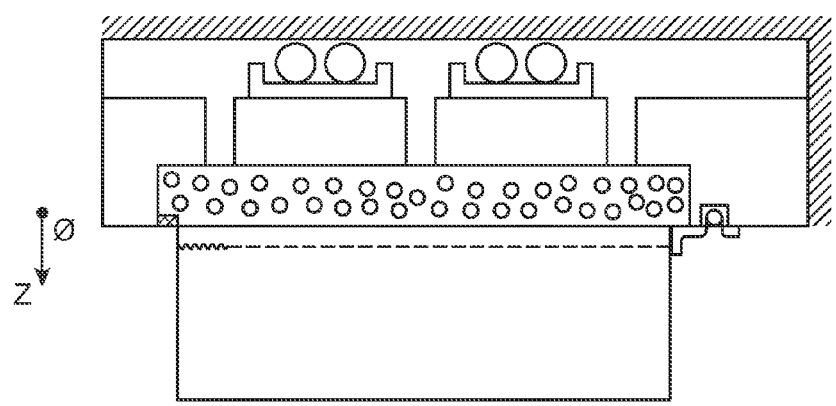

In the pre-loading phase shown in FIG. 18E, net forces in the vertical direction (Z-axis) may be applied to the workpiece by the linear actuator structures acting through the elevator and the chuck. In general, the preloading forces should be sufficient to maintain sealing between the workpiece and the S-layer and discourage cleaving upon first application of the pressure p.

In certain embodiments, this pre-loading force may be uniform over the workpiece area. Alternatively, however, a non-uniform pre-loading force may be applied in this phase. Such a situation is akin to causing the actuators to tilt the elevator in space, except that any movement of the stiff support in the Z-direction is constrained, thereby creating a force. Such a non-uniform pre-loading force may represent a force distribution within the orthogonal surface axes of the workpiece.

Thus in certain embodiments, a greater pre-loading force may be applied to the portion of the wafer opposite the cleave initiation region. As is described in detail below, such a non-uniform pre-loading force may serve to arrest cleave propagation, desirably allowing for incremental cleaving across the wafer in a controlled manner.

Figure 18F:
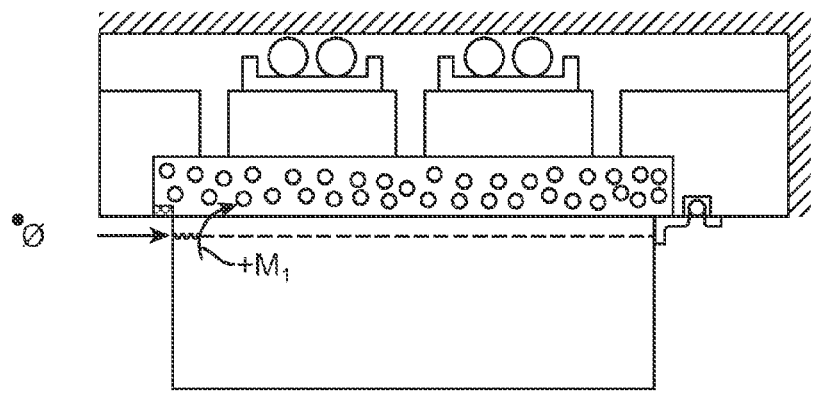

FIG. 18F shows a first loading phase. As shown in FIG. 18F, in this phase a (moment) loading force is applied to the workpiece. In particular, a compressed gas is flowed from a source into the chamber. This compressed gas creates a pressure in the gap extant between the cleaved portion and the remaining underlying material of the workpiece. The upward pressure of the compressed gas within the gap exerts a moment cleaving force $(+M_1)$ on the cleaved portion. Flexion in the compliant gripping layer accommodates movement of the cleaved portion in response to the moment, thereby allowing propagation of the cleave front in the lateral direction. This positive moment $(+M_1)$ can be used to develop a tab of large enough width within the higher dose region 1808 and its immediate surroundings.

Figure 18G:
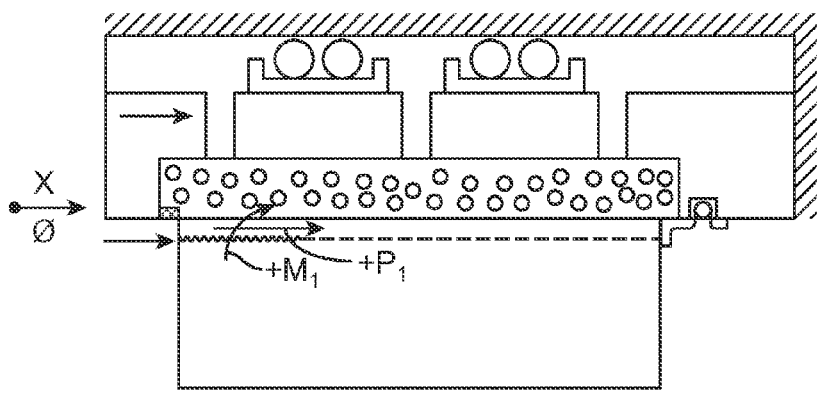

A second loading phase is shown in FIG. 18G. In this phase, while the first moment loading force is being maintained, a second linear loading force is applied to the workpiece. Specifically the actuator exerts a horizontal force against the projecting portion of the plate, sufficient to compress the plate along its lateral dimension to some extent. This compression of the plate produces some corresponding amount of horizontal movement relative to the stiff support along the X-axis. This horizontal movement is accommodated by the presence of the intervening ball bearings. The slight horizontal movement of the plate, while the workpiece remains fixed in position, exerts a linear cleaving shear force $(+P_1)$ on the cleaved portion of the workpiece. This force is communicated from the plate to the workpiece by the grip of the S-layer.

As shown in FIG. 18G, the combination of linear cleaving shear force $(+P_1)$ and moment cleaving force $(+M_1)$ acting upon the cleaved portion, serves to propagate cleaving in a highly uniform manner. In particular, the $+P_1$ and $+M_1$ cleaving forces are precisely and carefully controlled to achieve a mixity of fracture modes $(K_{II}/K_I)$ of near-zero $(K_{II} \approx 0)$. This allows the cleave front to extend into the cleave propagation region with little change in depth and without fracture of the thin and delicate cleaved portion.

Figure 18H:
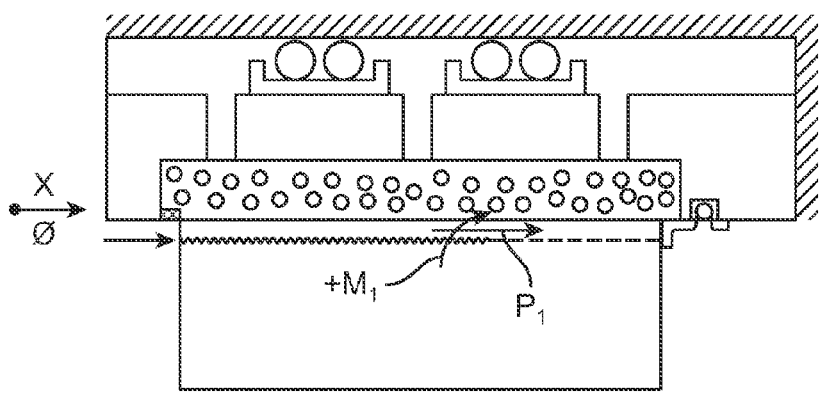

As shown in FIG. 18H, continued application of the $+P_1$ and $+M_1$ cleaving forces on the workpiece, result in propagation of the cleave front across the wafer, freeing an additional amount of the cleaved portion.

Figure 18I:
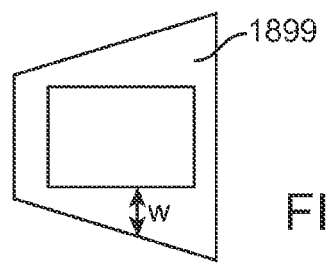

Some embodiments could employ a circumferential ring around the workpiece to achieve certain effects. For example, FIG. 18I shows a simplified plan view of the workpiece and the plate from the perspective of the chuck. In particular, the width W of the ring 1899 can determine the magnitude of the linear shear cleaving stress by reducing it linearly as the cleave progresses. Here, the increased width of the ring in the direction away from the piston, serves to reduce the effective $+P_1$ experienced by the top surface of the workpiece, thereby self-arresting unlimited cleaving from propagating indefinitely in an uncontrolled manner.

Because the force in the Z-direction exerted by the actuators has been stabilized by the conclusion of the pre-loading phase, the actuators can subsequently be monitored in order to detect an overall percentage of cleaving that has taken place across the workpiece.

Figure 19:
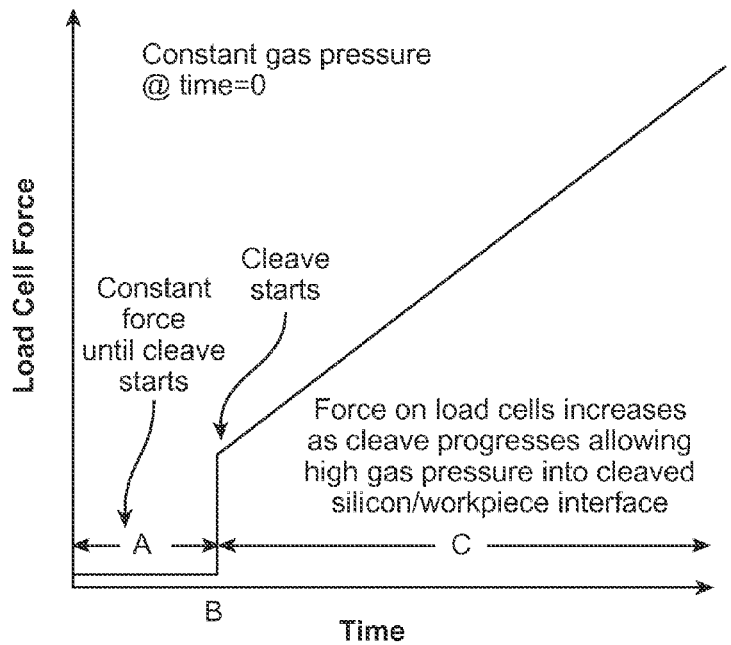
FIG. 19 plots load cell force versus time for an embodiment of a cleaving process.

FIG. 19 plots the force in the Z-direction against the workpiece (as measured by the load cell readings), versus the time of application of the compressed gas to the chamber. The plot of FIG. 19 is of the load cell forces versus time after the high gas pressure is established in the chamber at time=0. The load cells indicate a constant force over (A) until initiation starts (sudden jump at B). As the cleave progresses, there would be a linear increase in the force measured by the load cells. The constant force in part A says that the gas pressure is not changing and the cleave has not started.

FIG. 19 shows an interval A in which the cumulative pressure of the compressed gas is not sufficient to generate a large enough cleaving moment to begin the cleaving action. This region A is indicated in the graph by no change in the force along the vertical direction.

FIG. 19 shows that a point B, pressure of the compressed gas creates a moment sufficient to begin the controlled cleaving action. This is indicated in the graph by an abrupt increase in the signal from the load cells.

FIG. 19 further shows that over the subsequent interval C, the pressure of the compressed gas and the linear force imparted to the P-plate propagates the controlled cleaving. This is indicated in the graph by a positive slope indicating progressively larger area of the brick is being cleaved and therefore exposed to the higher pressure.

Figure 20:
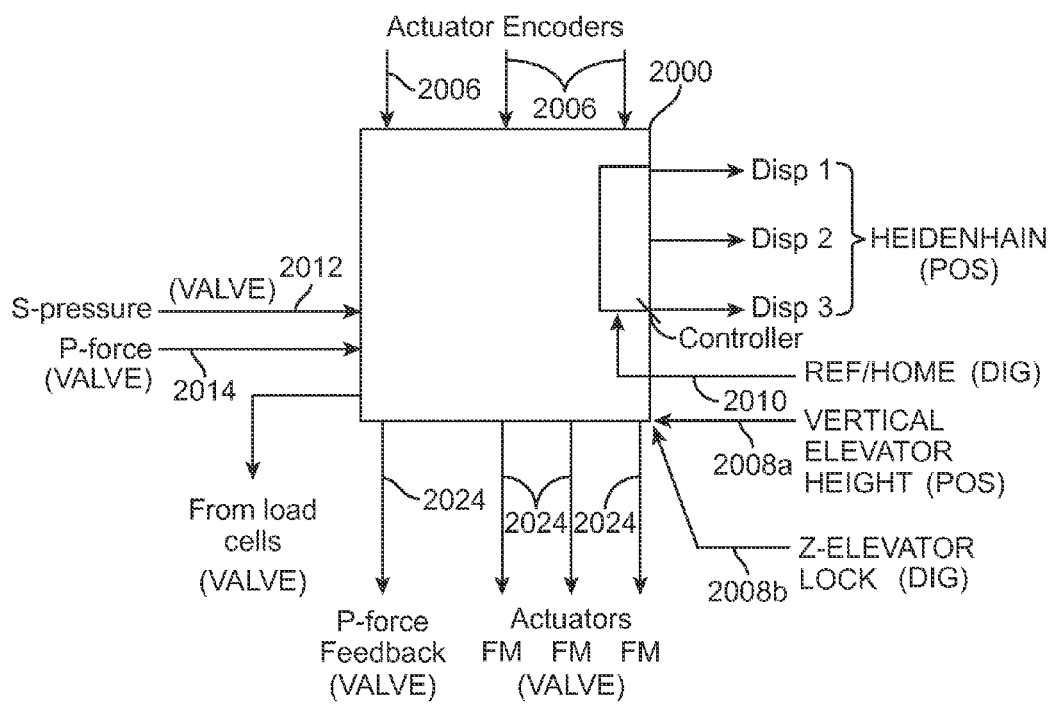
FIG. 20 shows a processor which may be used for performing a cleaving process.

As previously mentioned, operation of the apparatus may be controlled utilizing a processor based upon instructions in the form of code present on an associated computer-readable storage medium. FIG. 20 shows a simplified view of such a processor 2000, including the various inputs and outputs.

Specifically, FIG. 20 shows processor 2000 receiving input signals 506 indicating the readings from the actuator encoders. Processor 2000 is further configured to receive inputs 2008a-b indicating the vertical height elevator, and a digital signal indicating the locking status of the elevator, respectively. Processor 2000 is still further configured to receive a digital REF/HOME signal 2010 indicative of the start condition for operation. Processor 2000 also receives input 2012 indicating the pressure of the compressed gas, and input 2014 indicating the force being applied by the actuator.

Processor 2000 is also configured to correspondingly produce a number of different output signals. One output is a feedback signal 2022 to the piston actuator, to ensure application of the appropriate linear cleaving shear force ($+P_1$) for achieving the desired mixity ($K_{II} \approx 0$).

Other outputs from the processor include signals 2024 setting the forces exerted by the actuators. Signal 2022 is the P-force feedback.

As described above, embodiments of the present invention focus upon the precise and independent application of the linear cleaving force in combination with the moment cleaving force. The following table lists a number of parameters whose values may affect this controlled cleaving action:

| PARAMETER | CHANGE | RESULT |
|---|---|---|
| Compressed gas pressure | Increase | Increase ($+M_1$) |
| | Decrease | Decrease ($+M_1$) |
| Actuator P-plate force | Increase | Increase ($+P_1$) |
| | Decrease | Decrease ($+P_1$) |
| Young's modulus of P-plate | Increase | Decrease ($+P_1$) |
| | Decrease | Increase ($+P_1$) |
| Young's modulus of S-layer | Increase | Decrease ($+M_1$) |
| | Decrease | Increase ($+M_1$) |
| Width of plate | Increase | Decrease ($+P_1$) |
| | Decrease | Increase ($+P_1$) |
| Thickness of S-layer | Increase | Increase ($+M_1$) |
| | Decrease | Decrease ($+M_1$) |
| Dose of cleave plane | Increase | Decrease ($+M_1$), Increase ($-P_1$) |
| | Decrease | Increase ($+M_1$), Decrease ($-P_1$) |
| Pre-load force | Increase | Decrease ($+M_1$) |
| | Decrease | Increase ($+M_1$) |

These parameters may be changed between successive cleaving processes of different workpieces. Moreover, these parameters may also be varied within a cleaving process, for example to self-arrest unlimited cleaving from propagating in an uncontrolled manner. This is described above in connection with FIG. 18H. Other parameter variations that may have a similar effect include decreasing the thickness of the compliant layer away from the initiation region, or increasing a pre-loading force away from the initiation region.

EXAMPLE

These following table shows values of different characteristics of an embodiment which may be utilized to cleave thin layers of monocrystalline silicon from a workpiece.

| CHARACTERISTIC | VALUE |
|---|---|
| Workpiece | |
| Workpiece material | Mono-Si (111) |
| Workpiece thickness (H) | 5 to 100 mm |
| Workpiece Young's Modulus | 187 GPa |
| Surface Energy | 2.4 J/m² |
| Cleave Plane | |
| Cleaved layer thickness (h) | 20 to 150 µm |
| Cleaved portion length (l) | 60 to 156 mm |
| Implanted ion | Hydrogen |
| Implant Energy | 1 to 4 (MeV) |
| Initiation region dose | 6-9e16 (atoms/cm²) |
| Propagation region dose | 1 to 6e16 (atoms/cm²) |
| Cleave Moment | |
| Compliant layer material | Porous HDPE |
| Compliant layer Young's Modulus | 150 MPa |
| Compliant layer thickness | 6.3 mm |
| Pre-load pressure | 0 to compressed gas pressure value (0 in example) |
| Compressed Gas Pressure $+M_1$ | 0-150 PSI (40 PSI in example) 0.08 N-m/m (40 PSI and 0 PSI Pre-load) |
| Linear P-Plate | |
| Plate material | Delrin Acetal Resin Plastic |
| Plate Young's Modulus | 2.2 GPa |
| Plate width | 300 mm |
| Actuator (Piston) Force | 10,000 N/m on P-plate (3000 N in example) |
| $+P_1$ | 4,280 N/m in example |
| $K_I$ | 0.712 MPa-m$^{1/2}$ |
| $K_{II}$ | −0.007 MPa-m$^{1/2}$ |
| Mixity ($K_{II}/K_I$) | −0.01 |

While the embodiment discussed above in connection with FIG. 18 features an apparatus having an S-layer in direct contact with the workpiece, this is not required. Alternative embodiments could utilize a separate layer for gripping the workpiece. Such a gripping material would be calculated to exhibit both the desired amount of lateral compression, and the compliant, gripping characteristic in the vertical direction. Moreover, where vacuum force is used for sealing, the separate gripping layer should exhibit the desired porosity.

Certain embodiments could employ separate materials for the gripping and compliant characteristics. Such an embodiment could feature a compliant layer having the desired Young's modulus, and could also feature an intervening thin membrane composed of a different material having a sufficiently high coefficient of friction to ensure maintenance of the proper grip between the compliant layer and the workpiece.

The particular embodiments illustrated and described above are provided as examples and should not be viewed as limiting. Thus while FIG. 18 shows an embodiment of an apparatus that features a porous constraint plate sealed to the workpiece utilizing a vacuum and a lip seal, this is not required. Alternative embodiments could employ the application of other types of sealing forces and sealing structures. For example, an alternative embodiment could employ an S-layer having channels formed therein to allow the maintenance of a top pressure to develop the desired cleaving moment within the workpiece.

What is claimed is:

1. A method comprising:
    providing a surface of a workpiece in contact with a plate, the workpiece including an initial subsurface cleaved portion underlying a partially detached layer from the workpiece along the surface;
    applying a pre-loading force in a first direction to the workpiece surface in contact with the plate;
    applying a first loading force along the workpiece surface; and
    applying a second loading force using a gas pressure to propagate the initial subsurface cleaved portion to release a layer from the workpiece.

2. The method of claim 1 wherein the pre-loading force is substantially normal to the workpiece surface.

3. The method of claim 1 wherein the plate includes a compliant characteristic to accommodate movement of the layer during propagation of the initial subsurface cleaved portion.

4. The method of claim 1 wherein the first loading force is mechanically applied to the plate.

5. The method of claim 4 wherein movement of the plate along the direction of the first loading force is constrained to accommodate compression of the plate in response to the first loading force.

6. The method of claim 1 wherein the pre-loading force includes a tilt.

7. The method of claim 1 wherein the pre-loading force is based upon a calibration.

8. The method of claim 1 further comprising monitoring the pre-loading force for a change indicating propagation of the initial subsurface cleaved portion.

9. The method of claim 1 wherein the first loading force is applied from the initial subsurface cleaved portion to an uncleaved portion of the workpiece.

10. The method of claim 1 wherein the gas pressure is applied between the partially detached layer and the workpiece.

11. The method of claim 1 wherein the second loading force is applied simultaneous to the first loading force to maintain a low shear stress.

12. The method of claim 1 further comprising adjusting the first loading force based upon a feedback signal.

13. The method of claim 1 further comprising forming the initial subsurface cleaved portion with a localized thermal process.

14. The method of claim 1 wherein the initial subsurface cleaved portion is propagated in a subsurface cleave plane of the workpiece.

15. The method of claim 14 wherein the subsurface cleave plane comprises an implanted region.

16. The method of claim 15 wherein a dose of the implanted region is substantially constant along the subsurface cleave plane.

17. The method of claim 15 wherein the implanted region comprises:
    a higher dose region proximate to the initial subsurface cleaved portion; and
    a lower dose region distal from the initial subsurface cleaved portion.

* * * * *